United States Patent
Chanemougame et al.

(10) Patent No.: US 10,304,832 B1
(45) Date of Patent: May 28, 2019

(54) INTEGRATED CIRCUIT STRUCTURE INCORPORATING STACKED FIELD EFFECT TRANSISTORS AND METHOD

(71) Applicant: GLOBALFOUNDRIES INC., Grand Cayman (KY)

(72) Inventors: Daniel Chanemougame, Niskayuna, NY (US); Lars Liebmann, Mechanicville, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/814,440

(22) Filed: Nov. 16, 2017

(51) Int. Cl.
| | |
|---|---|
| *H01L 23/58* | (2006.01) |
| *H01L 27/092* | (2006.01) |
| *H01L 21/8238* | (2006.01) |
| *H01L 29/423* | (2006.01) |
| *H01L 29/417* | (2006.01) |
| *H01L 29/06* | (2006.01) |

(52) U.S. Cl.
CPC ........ *H01L 27/0924* (2013.01); *H01L 21/823807* (2013.01); *H01L 21/823821* (2013.01); *H01L 21/823828* (2013.01); *H01L 21/823871* (2013.01); *H01L 21/823878* (2013.01); *H01L 29/0653* (2013.01); *H01L 29/41791* (2013.01); *H01L 29/42372* (2013.01)

(58) Field of Classification Search
None
See application file for complete search history.

(56) References Cited

U.S. PATENT DOCUMENTS

| | | | |
|---|---|---|---|
| 8,274,119 B2 | 9/2012 | Xiao et al. | |
| 8,492,220 B2 | 7/2013 | Erickson et al. | |
| 9,431,388 B1 * | 8/2016 | Gauthier, Jr. | ....... H01L 27/0255 |
| 9,508,712 B2 | 11/2016 | Wahl et al. | |
| 9,685,564 B2 | 6/2017 | Sengupta et al. | |
| 9,837,414 B1 | 12/2017 | Balakrishnan et al. | |
| 10,090,193 B1 * | 10/2018 | Chanemougame | ... H01L 27/092 |

(Continued)

OTHER PUBLICATIONS

Guillaume Bouche, "F800 CFET Integration," IMEC Partner Technical Week Presentation, Apr. 25, 2017, Slide 14.

(Continued)

*Primary Examiner* — Kevin M Picardat
(74) *Attorney, Agent, or Firm* — Gibb & Riley, LLC; Anthony J. Canale

(57) ABSTRACT

Disclosed are integrated circuit (IC) structure embodiments that incorporate stacked pair(s) of field effect transistors (FETs) (e.g., gate-all-around FETs), including a lower FET and an upper FET on the lower FET, and various metal components that enable power and/or signal connections to the source/drain regions of those FETs. The metal components can include first buried wire(s) within an isolation region in a level below the stacked pair and a first embedded contact that electrically connects a source/drain region of the lower FET to a first buried wire. Optionally, the metal components can also include second buried wire(s) in dielectric material at the same level as the upper FET and a second embedded contact that electrically connects a source/drain region of the upper FET to a second buried wire. Also disclosed are embodiments of a method of forming such IC structure embodiments.

15 Claims, 26 Drawing Sheets

(56) References Cited

U.S. PATENT DOCUMENTS

| | | |
|---|---|---|
| 2007/0007601 A1 | 1/2007 | Hsu et al. |
| 2008/0173944 A1 | 7/2008 | Coronel et al. |
| 2009/0050941 A1 | 2/2009 | Yamazaki et al. |
| 2009/0142888 A1 | 6/2009 | Tsuchiya |
| 2010/0295021 A1 | 11/2010 | Chang et al. |
| 2011/0122682 A1* | 5/2011 | Elmegreen ............. B82Y 10/00 365/163 |
| 2011/0254013 A1 | 10/2011 | Xiao et al. |
| 2013/0341704 A1 | 12/2013 | Rachmady et al. |
| 2016/0043074 A1 | 2/2016 | Hurley et al. |
| 2016/0111513 A1 | 4/2016 | Liu et al. |
| 2017/0005106 A1 | 1/2017 | Zhang |
| 2017/0040321 A1 | 2/2017 | Mitard |
| 2017/0133279 A1 | 5/2017 | Peng |
| 2017/0162687 A1 | 6/2017 | Miyairi et al. |
| 2017/0243866 A1 | 8/2017 | Then et al. |
| 2018/0061766 A1 | 3/2018 | Goktepeli |
| 2018/0108577 A1 | 4/2018 | Zhu et al. |

OTHER PUBLICATIONS

Diederik Verkest, "Y107," IMEC Partner Technical Week Presentation, Apr. 24, 2017, Slides 40-41.

U.S. Appl. No. 15/814,445, Notice of Allowance dated Jun. 27, 2018, pp. 1-9.

U.S. Appl. No. 15/814,435, Notice of Allowance dated Oct. 25, 2018, pp. 1-7.

U.S. Appl. No. 15/814,435, Office Action Communication dated Jun. 15, 2018, pp. 1-9.

\* cited by examiner

US 10,304,832 B1

INTEGRATED CIRCUIT STRUCTURE INCORPORATING STACKED FIELD EFFECT TRANSISTORS AND METHOD

BACKGROUND

Field of the Invention

The present invention relates to integrated circuit (IC) structures and, more particularly, to embodiments of an IC structure that incorporates stacked field effect transistors (FETs), such as stacked gate-all-around field effect transistors (GAAFETs)) and various metal components that enable power and/or signal connections to the source/drain regions of the stacked FETs.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths but, unfortunately, the smaller channel lengths resulted in a corresponding increase in short channel effects.

In response, fin-type FETs (FINFETs) were developed. A FINFET is a non-planar FET that incorporates a semiconductor fin (i.e., an elongated, relatively tall and thin, essentially rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel region. It should be noted that, because the semiconductor fin is so thin, any field effects exhibited at the top surface are insignificant (i.e., negligible).

Recently, to improve drive current and electrostatics and to allow for further device size scaling, gate-all-around field effect transistors (GAAFETs) (e.g., nanowire-type GAAFETs or nanosheet-type GAAFETs) have been developed. A GAAFET includes elongated nanoshape(s) (e.g., nanowires or nanosheets), which extend laterally between source/drain regions, and a wrap-around gate structure, which wraps around the nanoshape(s) such that the nanoshape(s) function as channel region(s).

Also recently, to allow for area scaling of integrated circuits that incorporate stacked FETs, as opposed to side by side FETs, have been developed. Specifically, a conventional IC structure layout with multiple FETs will typically have a row of N-type FETs (e.g., a row of N-type GAAFETs) on one-side, a corresponding row of P-type FETs (e.g., a row of P-type GAAFETs) on the opposite side, and shared gates that traverse and are area adjacent to the channel regions of the side-by-side pairs of N-type and P-type FETs. For example, in the case of a side-by-side pair of GAAFETs, each shared gate extends laterally across and wraps around the channel regions of the N-type and P-type GAAFETs in the side-by-side pair. Contrarily, a layout with multiple stacked pairs of FETs will have: P-type FETs on one-level; N-type FETs on an adjacent level (i.e., above or below); dielectric layers that electrically isolate the source/drain regions of the lower FETs from those of the upper FETs; and shared gates that traverse and are adjacent to the channel regions of the stacked pairs of N-type and P-type FETs. For example, in the case of a stacked pair of GAAFETs, each shared gate extends vertically across and wraps around the channel regions of the N-type and P-type GAAFETs in the stacked pair. Unfortunately, while stacked pairs of FETs consume less chip area than side-by-side pairs of FETs, providing the necessary power and/or signal connections to the source/drain regions of the lower FETs in the stacked pairs can be complex and may limit the area savings.

SUMMARY

In view of the foregoing, disclosed herein are integrated circuit (IC) structure embodiments that incorporate one or more stacked pairs of FETs (e.g., gate-all-around field effect transistors (GAAFETs)) and various metal components that enable power and/or signal connections to the source/drain regions of those FETs.

Generally, each embodiment of the integrated circuit (IC) structure disclosed herein includes a semiconductor fin on a semiconductor substrate and an isolation region on the semiconductor substrate laterally surrounding the semiconductor fin.

Each embodiment of the IC structure further includes at least one stacked pair of field effect transistors (FETs) (e.g., a stacked pair of gate-all-around field effect transistor (GAAFETs)). The stacked pair of FETs can include a first FET and a second FET above the first FET. The first FET can include two first source/drain regions on the semiconductor fin and having side portions that extend over the isolation region. The first FET can further include at least one first channel region positioned laterally between the two first source/drain regions. A dielectric layer can cover the first source/drain regions. The second FET can include two second source/drain regions on the dielectric layer above the two first source/drain region, respectively. The second FET can further include at least one second channel region positioned laterally between the two second source/drain regions.

Each embodiment of the IC structure further includes a first buried wire (e.g., a first buried power wire, a first buried signal wire, etc.) within the isolation region positioned laterally adjacent to the semiconductor fin and, more particularly, parallel to and near the semiconductor fin, but physically separated from the semiconductor fin (e.g., by at least a vertical portion of a conformal dielectric layer). Each IC structure embodiment can further include a first embedded contact that is covered by the dielectric layer such that it is entirely below the level of the second FET and that extends vertically between and electrically connects one of the first source/drain regions of the first FET to the first buried wire.

One particular embodiment of the IC structure can include, not just one, but a pair of first buried wires (e.g., a first buried power wire and a first buried signal wire) in the isolation region such that the semiconductor fin is positioned laterally between the first buried wires. In this case, the IC structure can further include first embedded contacts that are covered by the dielectric layer such that they are entirely below the level of the second FET. These first embedded contacts can include one first embedded contact that extends vertically from one of the first source/drain regions of the first FET to one of the first buried wires and another first embedded contact that extends vertically from the other first source/drain region to the other first buried wire.

Optionally, each embodiment of the IC structure can further include at least one second buried wire (e.g., a second buried power wire, a second buried signal wire, etc.).

The second buried wire can be within dielectric material on one side of the stacked pair of transistors and, specifically, positioned laterally adjacent to one of the second source/drain regions of the second FET. Thus, for example, the second buried wire can be aligned above one of the first buried wires. In this case, a second embedded contact can electrically connect the second source/drain region and the second buried wire. That is, a second embedded contact can be within the second source/drain region and can further extend laterally beyond a side edge of the second source/drain region to the second buried wire.

Also disclosed herein are embodiments of a method of forming the above-described IC structure. Each of the embodiments of the method can include forming a stack of alternating semiconductor layers on a semiconductor substrate, wherein the semiconductor substrate is made of a first semiconductor material and the alternating layers in the stack include alternating layers of a second semiconductor material and the first semiconductor material.

An etch process can be performed in order to etch a multi-layer fin from the stack and this etch process can specifically be stopped just above the semiconductor substrate (i.e., within lowest layer of the second semiconductor material). For example, optionally, the lowest portion of the lowest layer of the second semiconductor material, which is immediately adjacent to the semiconductor substrate, can be doped so that this lowest portion can effectively function as an etch stop layer.

Next, sidewall spacers can be formed on the multi-layer fin and, specifically, positioned laterally adjacent to the sidewalls of the multi-layer fin and above the remaining lowest portion of the lowest layer of the second semiconductor material. At least one additional etch process can then be performed in order to etch a semiconductor fin in an upper portion of the semiconductor substrate such that the semiconductor fin is aligned directly below the multi-layer fin. An isolation region can then be formed on a lower portion on the semiconductor substrate such that it laterally surrounds the semiconductor fin and the multi-layer fin above.

A first buried wire trench can be etched in the isolation region such that it is parallel to the semiconductor fin and a first buried wire (e.g., a first buried power wire or a first buried signal wire) can be formed at the bottom of this first buried wire trench. Optionally, instead of forming a single first buried trench and a first buried wire therein, one embodiment of the method includes forming a pair of first buried wire trenches such that the semiconductor fin (and multi-layer fin above) is positioned laterally between them. In this case, first buried wires (e.g., a first buried power wire and a first buried signal wire) can be formed at the bottoms of the first buried wire trenches, respectively.

After the first buried wire(s) is/are formed, the isolation region can be refilled and then recessed, stopping above the level of the first buried wire(s) and the multi-layer fin can be exposed. The exposed multi-layer fin can then be used to form at least one stacked pair of field effect transistors (FETs) (e.g., at least one stacked pair of gate-all-around field effect transistors (GAAFETs)), wherein each stacked pair of FETs includes a first FET and a second FET that is above the first FET and that shares a gate with the first FET.

During formation of the stacked pair of FETs and, particularly, after formation of first source/drain regions for the first FET and before formation of second source/drain regions for the second FET, a first embedded contact can be formed in order to electrically connect a first source/drain region of the first FET to a first buried wire. If a pair of first buried wires was previously formed, multiple first embedded contacts can be formed to, for example, electrically connect one first source/drain region of the first FET to one of the first buried wires and to further electrically connect the other first source/drain region of the first FET to a different one of the first buried wire (i.e., to electrically connect the different first source/drain regions to different first buried wires).

Optionally, during formation of the stacked pair of FETs and, particularly, after formation of second source/drain regions for the second FET, at least one second buried wire (e.g., a second buried power wire and/or a second buried signal wire) can also be formed in interlayer dielectric material that is positioned laterally adjacent to the second source/drain regions. Also, optionally, a second embedded contact can be formed to electrically connect a second source/drain region of the second FET to an adjacent second buried wire. That is, a second embedded contact can be formed so that it is in the second source/drain region and so that it further extends laterally beyond a side edge of the second source/drain region to the second buried wire.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
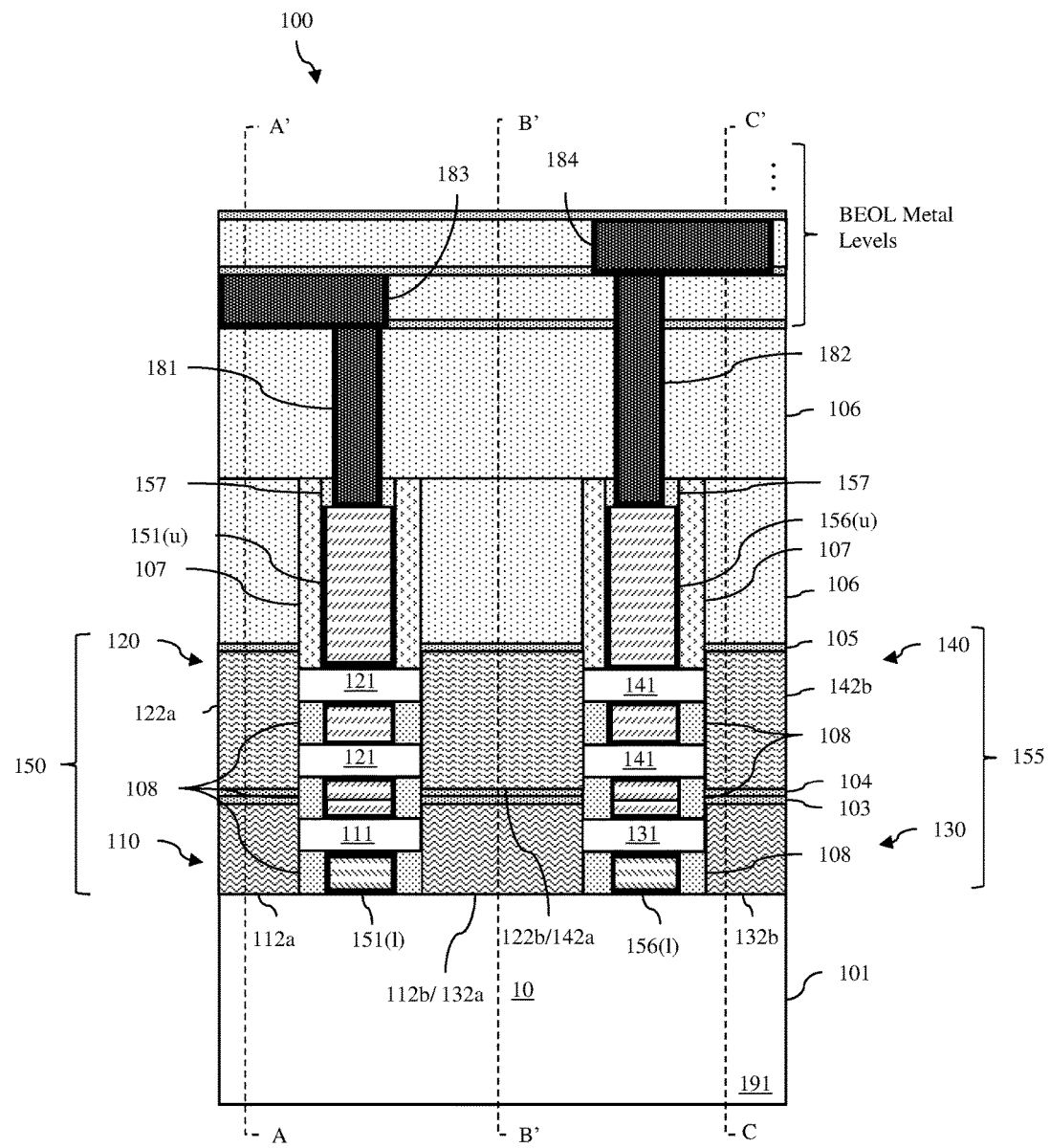
FIGS. 1A-1D and FIG. 1E are different cross-section diagrams and a layout diagram of an embodiment of an integrated circuit (IC) structure.

As mentioned above, a conventional layout with multiple field effect transistors (FETs) (e.g., multiple gate-all-around field effect transistors (GAAFETs)) will typically have a row of N-type FETs on one-side, a corresponding row of P-type FETs on the opposite side, and shared gates that traverse and are adjacent to the channel regions of side-by-side pairs of N-type and P-type FETs. Contrarily, a layout with multiple stacked pairs of FETs (e.g., stacked pairs of GAAFETs) will have P-type FETs on one-level, N-type FETs on an adjacent level (i.e., above or below) and, shared gates that extend vertically across and are adjacent to the channel regions of stacked pairs of N-type and P-type FETs. Unfortunately, while stacked pairs of N-type and P-type FETs consume less chip area than side-by-side pairs of N-type and P-type FETs, providing the necessary power and/or signal connections to the source/drain regions of the lower FETs in the stacked pairs can be complex and may limit the area savings.

In view of the foregoing, disclosed herein are integrated circuit (IC) structure embodiments that incorporate one or more stacked pairs of field effect transistors (FETs) (e.g., one or more stacked pairs of gate-all-around field effect transistors (GAAFETs)), and various metal components that enable power and/or signal connections to the source/drain regions of the FETs and that facilitate size scaling of cells that incorporate the stacked pairs (e.g., by reducing the number of metal tracks required). Each stacked pair of FETs can include a first FET (i.e., a lower FET) and a second FET (i.e., an upper FET) stacked on the first FET. The metal components can include at least one first buried wire (e.g., a first buried power wire and/or a first buried signal wire) within an isolation region in a level below the first FET and a first embedded contact that electrically connects a first source/drain region of the first FET to that first buried wire. Optionally, the metal components can include a pair of first buried wires within the isolation region below the first FET and first embedded contacts that electrically connect different first source/drain regions of the first FET to different first buried wires. Optionally, the metal components can further include at least one second buried wire (e.g., a second buried power wire and/or a second buried signal wire) in interlayer dielectric (ILD) material at the same level as the second FET and a second embedded contact that electrically connects a second source/drain region of the second FET to that second buried wire. Also disclosed herein are embodiments of a method of forming such IC structure embodiments.

More particularly, referring to FIGS. 1A-1E, disclosed herein are embodiments of an integrated circuit (IC) structure 100.

The IC structure 100 can include a semiconductor substrate 101. The semiconductor substrate 101 can be a bulk semiconductor substrate, such as a bulk silicon substrate. Alternatively, the semiconductor substrate 101 can be the semiconductor layer of a semiconductor-on-insulator (SOI) structure. In any case, a semiconductor fin 10 can be patterned in an upper portion of the semiconductor substrate 101 such that the semiconductor fin 10 extends vertically upward from a lower portion of the semiconductor substrate 101. The semiconductor substrate 101 can be made, for example, of a first semiconductor material (e.g., monocrystalline silicon).

The IC structure 100 can further include an isolation region 102 (e.g., a trench isolation region), which is on the lower portion of the semiconductor substrate 101 and which laterally surrounds the semiconductor fin 10. The isolation region 102 can include, for example, an optional conformal dielectric layer 109 made of a first dielectric material (e.g., silicon nitride). This conformal dielectric layer 109 can be relatively thin and can have horizontal portions on the top surface of the lower portion of the semiconductor substrate 101 and vertical portions on the sidewalls of the semiconductor fin 10. The isolation region 102 can further include an additional dielectric layer made of a second dielectric material that is different from the first dielectric material. For example, the second dielectric material can be an interlayer dielectric (ILD) material, such as silicon dioxide, or any other suitable ILD material.

The IC structure 100 can further include at least one stacked pair of field effect transistors (FETs) above the semiconductor fin 10 and the isolation region 102 and various metal components including, but not limited to, buried wire(s) and embedded contact(s), that enable power and/or signal connections to the source/drain regions of the FETs and that facilitate size scaling of cells that incorporate the stacked pairs by reducing the number of metal tracks required.

For purposes of illustration, FIGS. 1A-1E show a portion of an exemplary cell that includes two adjacent stacked pairs 150, 155 of gate-all-around field effect transistors (GAAFETs). However, FIGS. 1A-1E are not intended to be limiting. It should be understood that, alternatively, the IC structure could include one or more stacked pairs of different types of FETs (e.g., stacked pairs of fin-type FETs (FINFETs), etc.) and can further include different combinations of the metal components and, particularly, different combinations of the buried wire(s) and embedded contact(s) described below.

In any case, each stacked pair 150, 155 of FETs can include a first FET 110, 130 (also referred to herein as a lower FET), a second FET 120, 140 stacked above the first FET 110, 130, and a shared gate 151, 156 for the two FETs.

Specifically, the first FET 110, 130 can be a first-type FET (e.g., a P-type FET) that is aligned above and oriented parallel to the semiconductor fin 10 and can include two first source/drain regions 112a-112b, 132a-132b on the top surface of the semiconductor fin 10 and at least one first channel region 111, 131 positioned laterally between the two first source/drain regions 112a-112b, 132a-132b. That is, the first channel region(s) 111, 131 can have opposing ends that are immediately adjacent to the two first source/drain regions 112a-112b, 132a-132b. The first source/drain regions 112a-112b, 132a-132b can be wider than the semiconductor fin 10 such that side portions of the first source/drain regions 112a-112b, 132a-132b extend over the isolation region 102. For purposes of illustration, the first FET 110, 130 in each stacked pair is shown as having one first channel region 111, 131. However, it should be understood that, alternatively, the first FET 110, 130 could have any number of one or more first channel regions.

The first source/drain regions 112a-112b, 132a-132b can be made of an epitaxial semiconductor material, which is doped so as to have a first-type conductivity (e.g., P-type conductivity) at a relatively high conductivity level. The first channel region(s) 111, 131 can be made of a semiconductor material, which is either undoped or, optionally, doped so as to have a second-type conductivity (e.g., N-type conductivity) at a relatively low conductivity level. The epitaxial semiconductor material of the first source/drain regions 112a-112b, 132a-132b and the semiconductor material of the first channel region(s) 111, 131 can be the same semiconductor material (e.g., silicon or any other suitable semiconductor material). Alternatively, the epitaxial semiconductor material of the first source/drain regions 112a-112b, 132a-132b can be different from the semiconductor material of the first channel region(s) 111, 131 and can be pre-selected for optimal charge carrier mobility within the first FET.

The second FET 120, 140 can be a second-type FET (e.g., an N-type FET). The second FET 120, 140 can include two second source/drain regions 122a-122b, 142a-142b and at least one second channel region 121, 141 positioned laterally between the two second source/drain regions 122a-122b, 142a-142b. That is, the second channel region(s) 121, 141 can have opposing ends that are immediately adjacent to the second source/drain regions 122a-122b, 142a-142b. The two second source/drain regions 122a-122b, 142a-142b and the second channel region(s) 121, 141 can be aligned above the two first source/drain regions 112a-112b, 132a-132b and the first channel region(s) 111, 131, respectively. The two second source/drain regions 122a-122b, 142a-142b can be electrically isolated from the two first source/drain regions 112a-112b, 132a-132b by at least one conformal dielectric layer 103, 104 (e.g., a silicon nitride layer or other suitable dielectric layer) that covers the two first source/drain regions 112a-112b, 132a-132b. For purposes of illustration, the second FET 120, 140 in each stacked pair of FETs is shown as having two second channel regions 121, 141. However, it should be understood that, alternatively, the second FET 120, 140 could have any number of one or more second channel regions 121, 141.

The second source/drain regions 122a-122b, 142a-142b can be made of an epitaxial semiconductor material, which is doped so as to have the second-type conductivity (e.g., N-type conductivity) at a relatively high conductivity level. The second channel region(s) 121, 141 can be made of a semiconductor material, which is either undoped or, optionally, doped so as to have the first-type conductivity (e.g., P-type conductivity) at a relatively low conductivity level. The epitaxial semiconductor material of the second source/drain regions 122a-122b, 142a-142b and the semiconductor material of the second channel region(s) 121, 141 can be the same semiconductor material (e.g., silicon or any other suitable semiconductor material). Alternatively, the epitaxial semiconductor material of the second source/drain regions 122a-122b, 142a-142b can be different from the semiconductor material of the second channel region(s) 121, 141 and can be pre-selected for optimal charge carrier mobility within the second FET.

It should be noted that, when an IC structure includes multiple stacked pairs of FETs, adjacent first FETs (e.g., adjacent lower FETs) can have a shared first source/drain region and adjacent second FETs (e.g., adjacent upper FETs) can have a shared second source/drain region. That is, instead of having discrete, source/drain regions that are electrically isolated from each other (e.g., by an isolation region) adjacent FETs can have a single, contiguous source/drain region that extends between their respective channel regions. For example, as shown in FIG. 1A, the first FET 110 is adjacent to the first FET 130 and a shared first source/drain region 112b/132a extends between the first channel region(s) 111 of the first FET 110 and the first channel region(s) 131 of the first FET 130. Similarly, the second FET 120 is adjacent to the second FET 140 and a shared second source/drain region 122b/142a extends between the second channel region(s) 121 of the second FET 120 and the second channel region(s) 141 of the second FET 140.

It should further be noted that, in the case of stacked GAAFETs, the first channel region(s) 111, 121 of the first GAAFET 110, 130 and the second channel region(s) 131, 141 of the second GAAFET 120, 130 can be in the form of elongated semiconductor nanoshapes (NSs). For purposes of this disclosure, an elongated semiconductor nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). Nanoshapes include nanowires, nanosheets and nanofins. Specifically, a nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin.

In any case, the elongated semiconductor nanoshapes can be horizontally oriented relative to the top surface the semiconductor substrate. The lowest first channel region can be physically separated from the top of the semiconductor fin 10. Each additional first channel region (if any) can be aligned above, parallel to, and physically separated from the one below. The lowest second channel region can be aligned above, parallel to, and physically separated from the highest first channel region. Each additional second channel region (if any) can be aligned above, parallel to, and physically separated from the one below.

The shared gate 151, 156 can have a lower section (1) adjacent to the first channel region(s) 111, 131 and an upper section (u) adjacent to the second channel region(s) 121, 141. For example, in GAAFETs, the lower section (1) can be on the semiconductor substrate and can wrap around the first channel region(s) 111, 131 (i.e. can be above, below and on the opposing sides of the first channel region(s) 111, 131) of the first GAAFET 110, 130. The upper section (u) can be above the lower section (1) and can wrap around the second channel region(s) 121, 141 (i.e. can be above, below and on the opposing sides of the second channel region(s) 121, 141) of the second GAAFET 120, 140.

The shared gate 151, 156 can be, for example, a shared single work function replacement metal gate (RMG) or, alternatively, a shared dual work function replacement metal gate (RMG). That is, in both the lower and upper sections, the shared gate 151, 156 can include a conformal gate dielectric layer (e.g., a conformal high-K gate dielectric layer) immediately adjacent to and, in the case of GAAFETs, wrapping around the first channel region(s) and the second channel region(s). In one embodiment, the same metal gate conductor materials can be adjacent to the gate dielectric layer in both the lower and upper sections. In another embodiment, the shared gate 151, 156 can further include: a conformal first work function metal layer in the lower section immediately adjacent to that portion of the gate dielectric layer on the first channel region(s) and a second conformal work function metal layer in the upper section immediately adjacent to that portion of the gate dielectric layer on the second channel region(s). The first work function metal layer can be preselected for optimal performance of a first-type FET (e.g., a P-type FET). The second work function metal layer can be different from the first work function metal layer and can be preselected for optimal performance of a second-type FET (e.g., an N-type FET). In this case, the shared gate 151, 156 can optionally further include a conductive fill material adjacent to the first work function metal layer in the lower section and further adjacent to the second work function metal layer in the upper section. Shared dual work function RMGs for stacked pairs of FETs are well known in the art. Thus, in order to avoid clutter in the drawings and allow the reader to focus on the salient aspects of the disclosed embodiments, only the shared RMGs 151, 156, as a whole, are identified in the figures and the individual components of these shared RMGs (e.g., the gate dielectric layer, the different work function metal layers, the conductive fill material, etc.) are not specifically identified.

In any case, each shared gate 151, 156 can have a dielectric gate cap 157 and dielectric gate sidewalls spacers 107. The gate cap 157 and gate sidewall spacers 107 can be made of the same dielectric material (e.g., silicon nitride or any other suitable dielectric material). Alternatively, the gate cap 157 and gate sidewall spacers 107 can be made of different dielectric materials. For example, the gate cap 157 can be made of silicon nitride and the gate sidewall spacers 107 can be made of silicon carbon nitride, silicon boron carbon nitride or any other suitable dielectric material.

Furthermore, in the case of stacked pairs of GAAFETS, a combination of the gate sidewall spacers 107 and vertically oriented isolation elements 108 can electrically isolate the shared gate 151, 156 from the adjacent source/drain regions. The vertically oriented isolation elements 108 can be on opposing sides of each shared gate 151, 156 positioned laterally adjacent to sections of vertical surfaces of the shared gate that extend from the top of the semiconductor substrate to the bottom of the lowest first channel region and that further extend between adjacent channel regions. The isolation elements can be, for example, nitride layers (e.g., silicon nitride layers) or layers of any other suitable isolation material.

For purposes of illustration, the first FET 110, 130 and the second FET 120, 140 in the stacked pairs of FETs have different type conductivities. That is, the first FET 110, 130 (i.e., the lower FET) can be a P-type FET and the second FET 120, 140 (i.e., the upper FET) can be an N-type FET or vice versa. However, it should be understood that this description is not intended to be limiting. Alternatively, the first FET 110, 130 and the second FET 120, 140 in any given stacked pair of FETs could have the same type conductivity. For example, the first FET 110, 130 and the second FET 120, 140 could both be P-type FETs or they could both be N-type FETs.

As mentioned above, the IC structure 100 can further include various metal components. The metal components can enable power and/or signal connections to the first source/drain regions of the first FET (i.e., a lower FET) in the stacked pair of FETs. Such metal components can include one or more first buried wires 171, 172 (e.g., a first buried power wire and/or a first buried signal wire) within the isolation region 102, which as discussed above is below the level of the one or more stacked pairs of FETs, and first embedded contact(s) 161, 162/162' that electrically connect first source/drain regions of first FET(s) the first buried wire(s) 171, 172, respectively. For purposes of this disclosure, a buried wire refers to a front end of the line (FEOL) wire and, more particularly, a wire that is formed during FEOL processing so as to be either below or at the same level as the IC structure devices as opposed to a wire that is formed during back end of the line (BEOL) processing so as to be in a metal level above the IC structure devices.

The metal components can also enable power and/or signal connections to the second source/drain regions of a second FET (i.e., an upper FET) in a stacked pair of FETs. Such metal components can include conventional middle of the line (MOL) contacts to back end of the line (BEOL) metal levels and/or one or more second buried wires 173, 174 (e.g., a second buried power wire and/or a second buried signal wire) within the second dielectric material 106 at the same level as the second source/drain regions (e.g., aligned directly above the first buried wire(s) 171, 172), and second embedded contact(s) 163, 164 that electrically connect second source/drain regions of second FET(s) to the second buried wire(s) 173, 174, respectively.

Those skilled in the art will recognize that, depending upon the design of a cell, the required power and/or signal connections for a given one of the source/drain regions of a given one of the FETs within a stacked pair of FETs will vary. Thus, in the portion of the exemplary cell shown in FIGS. 1A-1E, the signal and power connections to the source/drain regions of the FETs in the stacked pair 150 are different from those in the stacked pair 155.

Figure 1B:
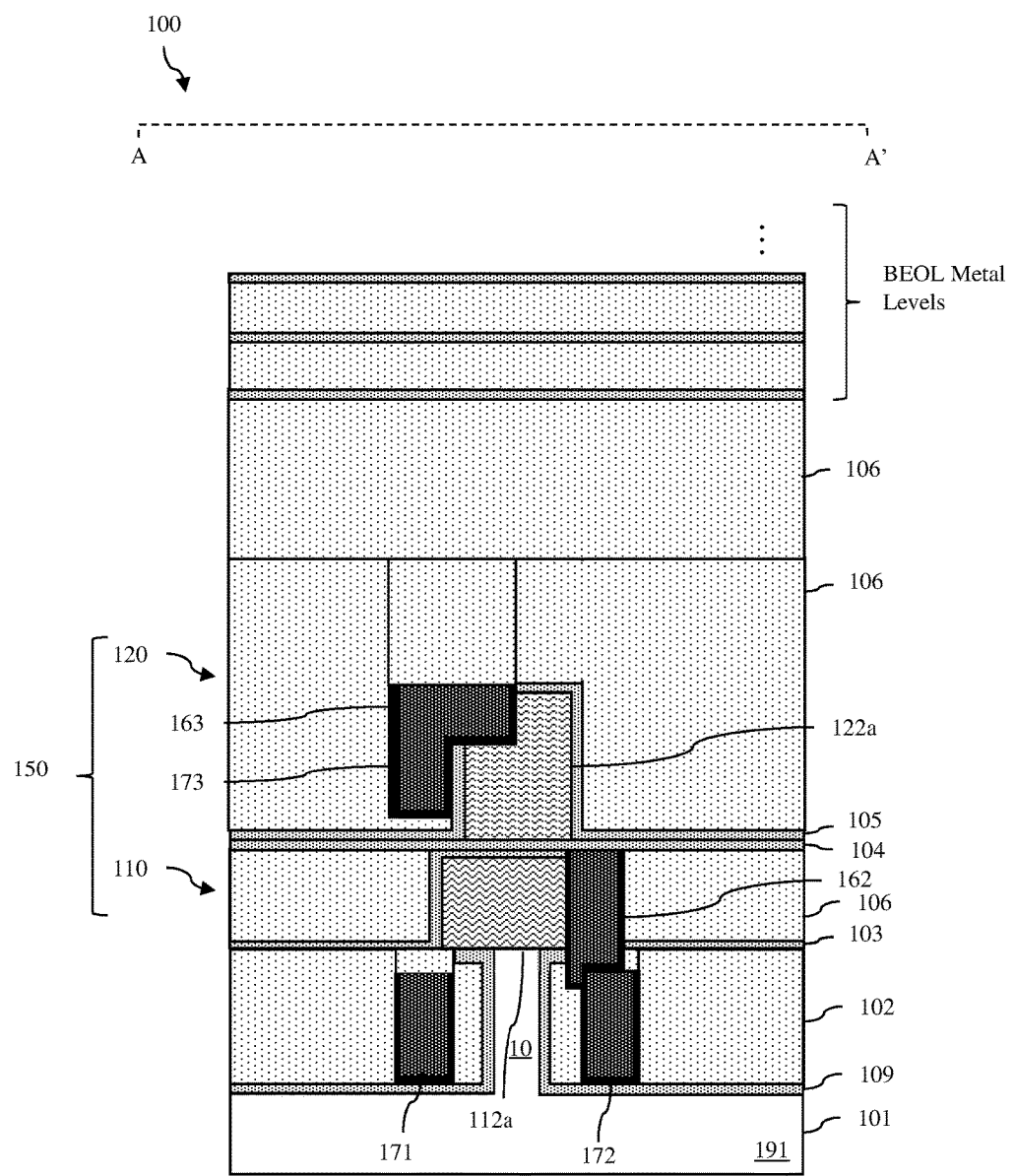
Figure 1C:
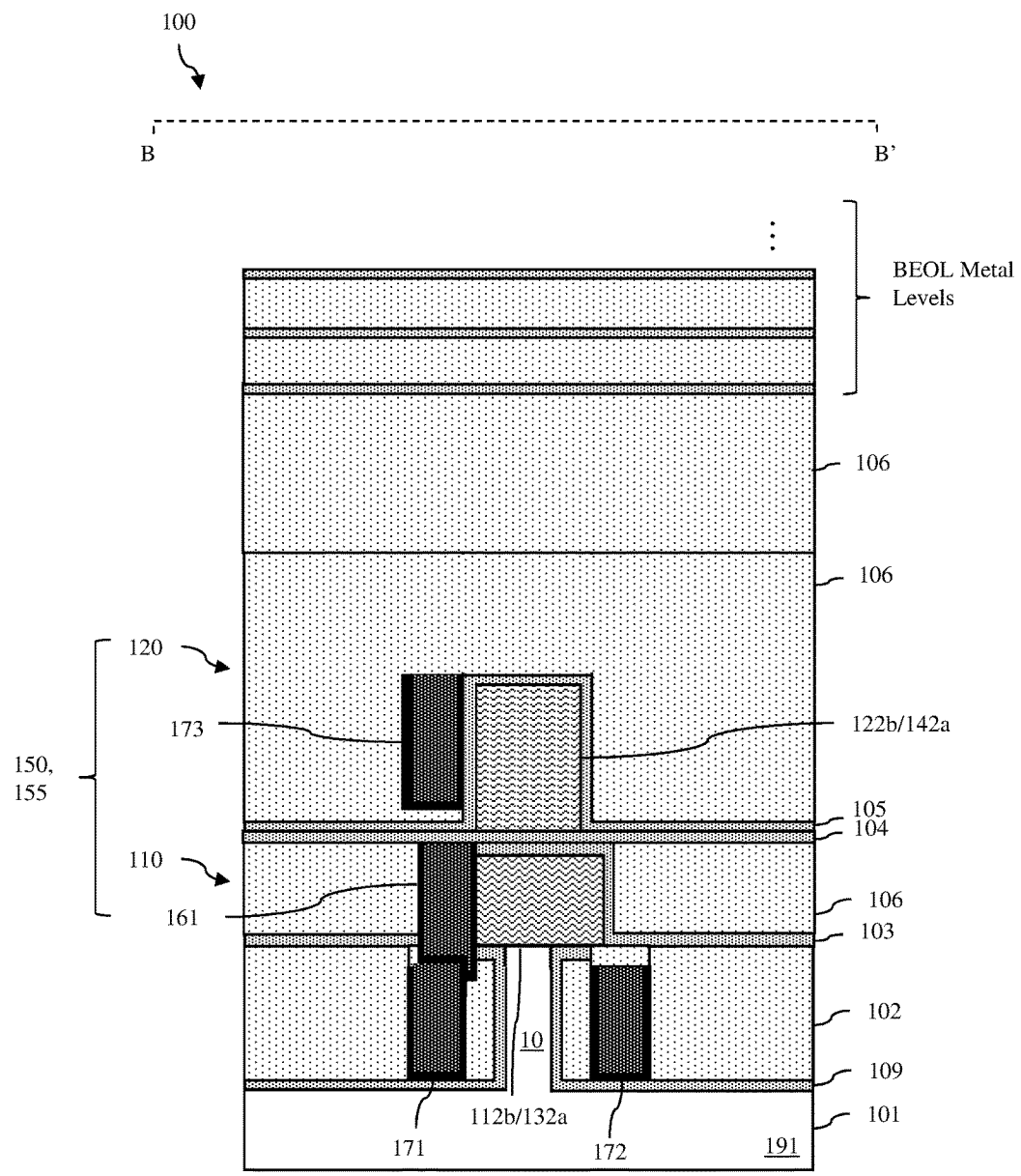
Figure 1D:
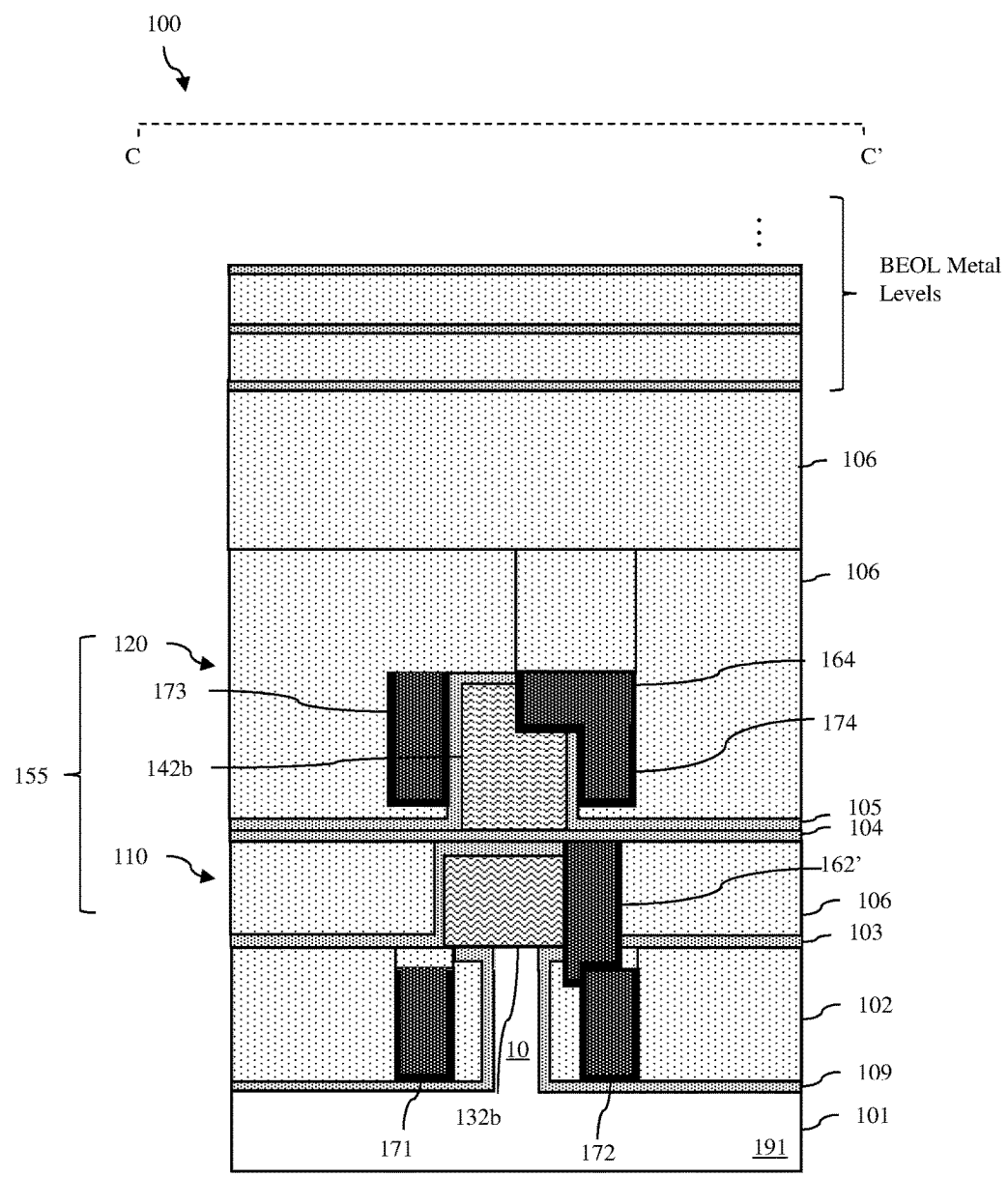

For example, referring to FIGS. 1B and 1C, which show different cross-sections of the stacked pair 150 of FETs, and further referring to FIGS. 1C and 1D, which show different cross-sections of the stacked pair 155 of FETs, the semiconductor fin 10 can be positioned laterally between a first buried wire 171 (e.g., a buried power or signal wire) and another first buried wire 172 (e.g., a buried signal wire).

In the stacked pair 150, the first source/drain region 112a of the first FET 110 can be electrically connected to the first buried wire 172 by a first embedded contact 162 (see FIG. 1B). This first embedded contact 162 is entirely below the level of the second FET 120, has an upper portion with at least a sidewall that abuts a side surface of the first source/drain region 112a and a lower portion that extends vertically from the first source/drain region 112a through a conformal dielectric layer 103 of the first dielectric material (e.g., silicon nitride) and into the isolation region 102 below to the first buried wire 172. This first embedded contact 162 can land on the top surface of the first buried wire 172 and, optionally, can extend deeper into the isolation region 102 such that a sidewall of the first embedded contact 162 abuts a sidewall of the first buried wire 172, as illustrated.

A second buried wire 173 (e.g., a buried power or signal wire) can be at the same level as the second FET 120 within the second dielectric material 106 and aligned above the first buried wire 171 so as to be positioned laterally adjacent to the second source/drain region 122a of the second FET 120. A second embedded contact 163 can be within the second source/drain region 122a and can extend laterally beyond a side edge of the second source/drain region 122a to the second buried wire 173.

At the interface between the stacked pairs 150, 155, the first source/drain region 112b/132a of the first FET 110/130 can be electrically connected to the first buried wire 171 by a first embedded contact 161 (see FIG. 1C). This first embedded contact 161 is entirely below the level of the second FET 120/140, has an upper portion with at least a sidewall that abuts the first source/drain region 112b/132a and a lower portion that extends vertically from the first source/drain region 112b/132a through the conformal dielectric layer 103 and into the isolation region 102 below to the first buried wire 171. This first embedded contact 161 can land on the top surface of the first buried wire 171 and, optionally, can extend deeper into the isolation region 102 such that a sidewall of the first embedded contact 161 abuts a sidewall of the first buried wire 171, as illustrated.

In the stacked pair 155, the first source/drain region 132b of the first FET 130 can be electrically connected to the first buried wire 172 by a first embedded contact 162' (see FIG. 1D). This first embedded contact 162' is entirely below the level of the second FET 140, has an upper portion with at least a sidewall that abuts the first source/drain region 132b and a lower portion that extends vertically from the first source/drain region 132b through the conformal dielectric layer 103 and into the isolation region 102 below to the first buried wire 172. This first embedded contact 162' can land on the top surface of the first buried wire 172 and, optionally, can extend deeper into the isolation region 102 such that a sidewall of the first embedded contact 162' abuts a sidewall of the first buried wire 172, as illustrated.

Second buried wires 173 and 174 (e.g., second buried power or signal wires) can be at the same level as the second FET 140 within the second dielectric material 106 and aligned above the first buried wires 171 and 172, respectively, so that the second source/drain region 142b of the second FET 140 is positioned laterally between second buried wires 173 and 174. A second embedded contact 164 can be within the second source/drain region 142b and can extend laterally beyond a side edge of the second source/drain region 142b to the second buried wire 174.

Figure 1E:
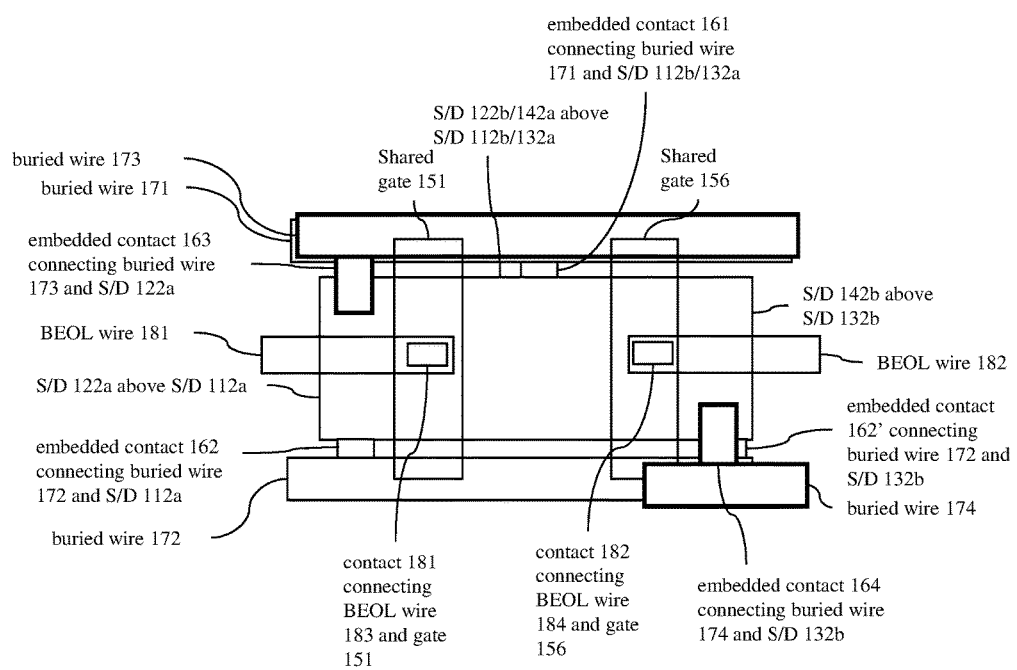

The IC structure 100 can further include conventional middle of the line (MOL) contacts 181 and 182 that electrically connect the shared gates 151 and 156 to back end of the line (BEOL) metal level wires 183 and 184, respectively (see FIGS. 1A and 1E). Optionally, the IC structure 100 can further include additional conventional MOL contacts (not shown) that electrically connect one or more of the second source/drain regions to BEOL metal levels and/or insulated contacts (not shown) that electrically connect one or more of the first source/drain regions to BEOL metals levels.

Figure 2A:
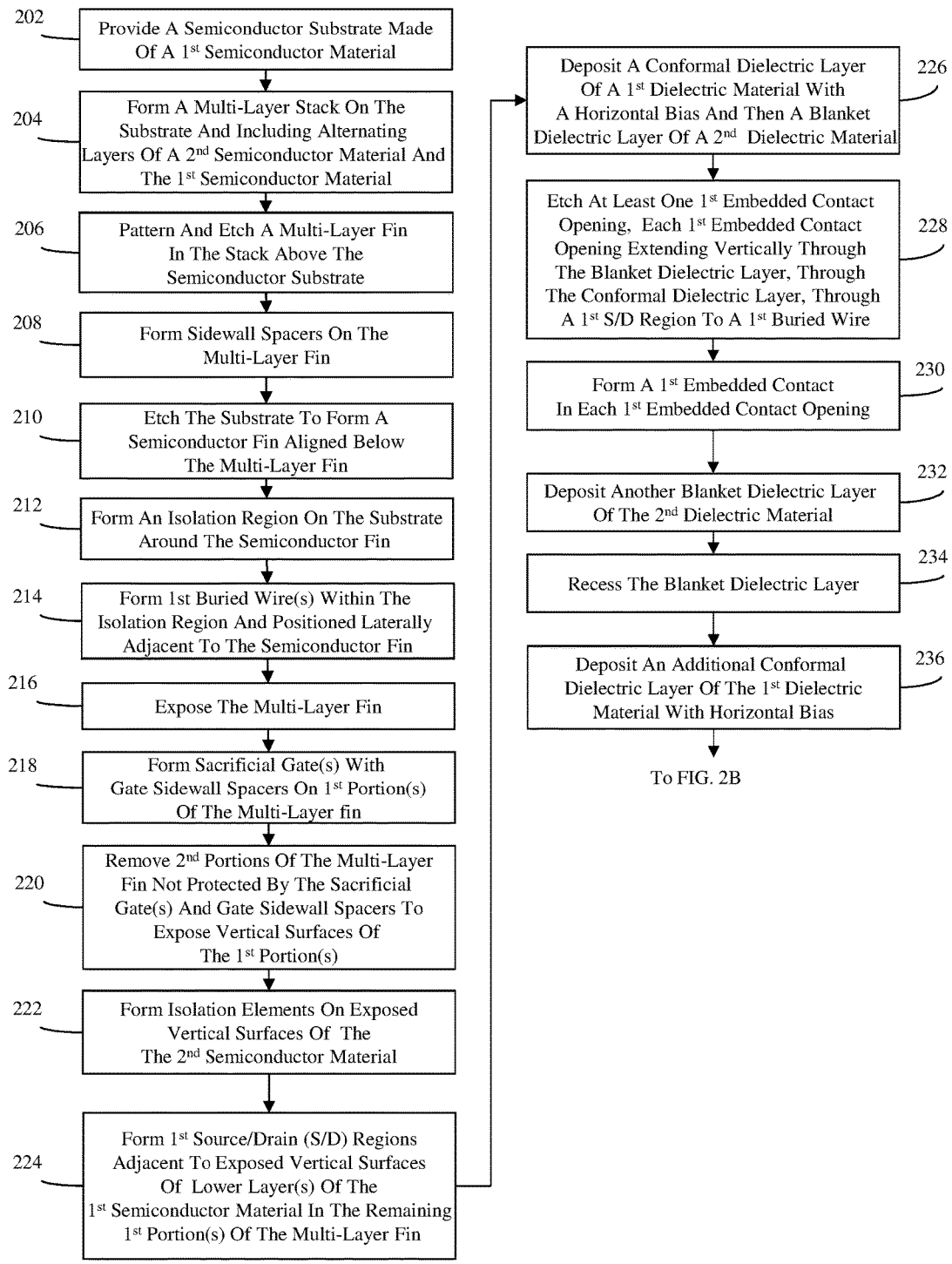
FIGS. 2A-2B are a flow diagram illustrating an embodiment of a method of forming the IC structure of FIGS. 1A-1E.
Figure 2B:
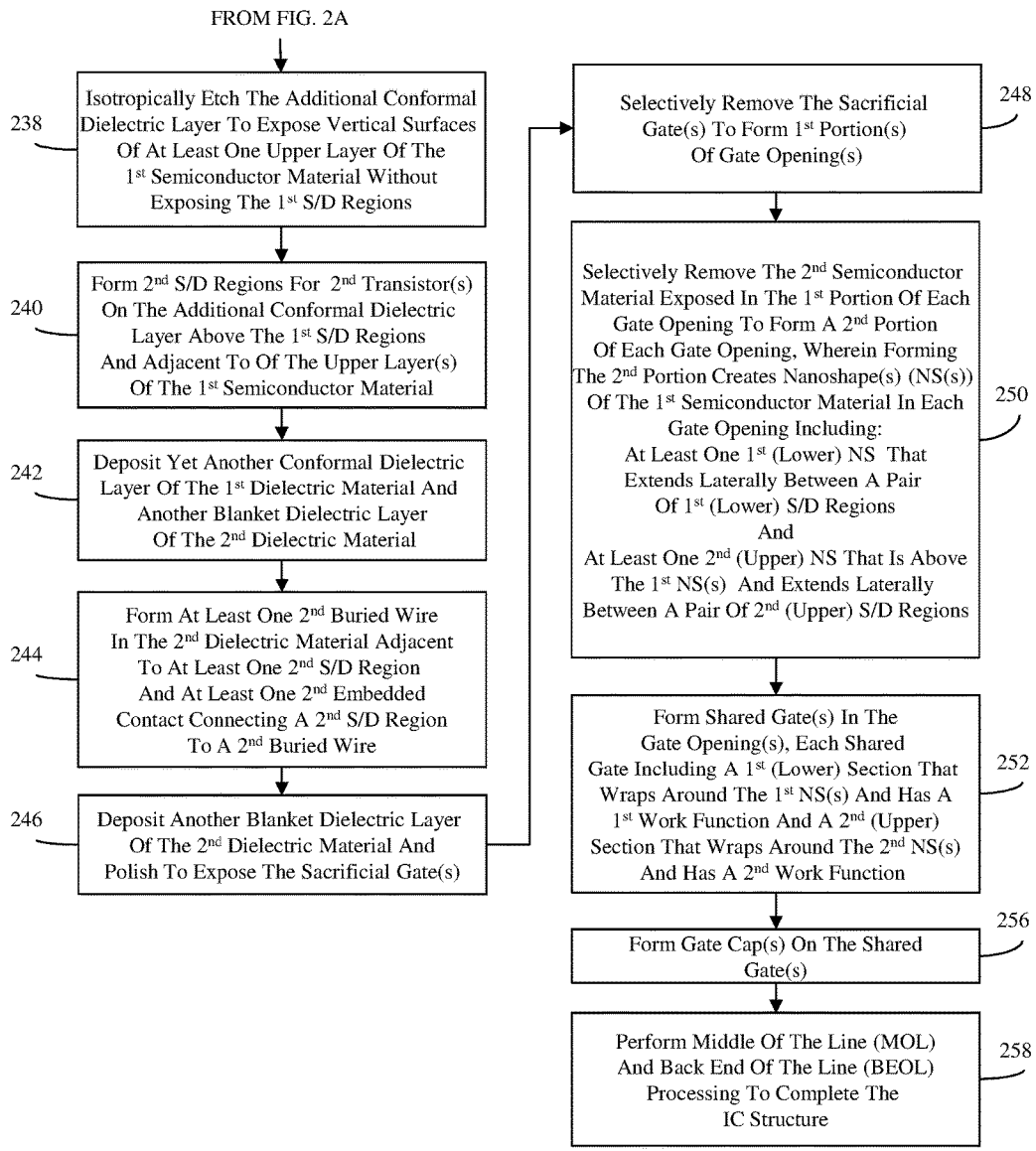

As mentioned above, FIGS. 1A-1E are not intended to be limiting and that different embodiments of the disclosed IC structure can include one or more stacked pairs of different types of FETs (e.g., one or more stacked pairs of fin-type FETs (FINFETs), etc.) and can include different combinations of the above-described metal components. The flow diagram of FIGS. 2A-2B illustrates an exemplary method for forming the IC structure 100, as it is shown in FIGS. 1A-1E, with one or more stacked pairs of GAAFETs. It should, however, be understood that the description of the method and the figures are not intended to be limiting.

Figure 3A:
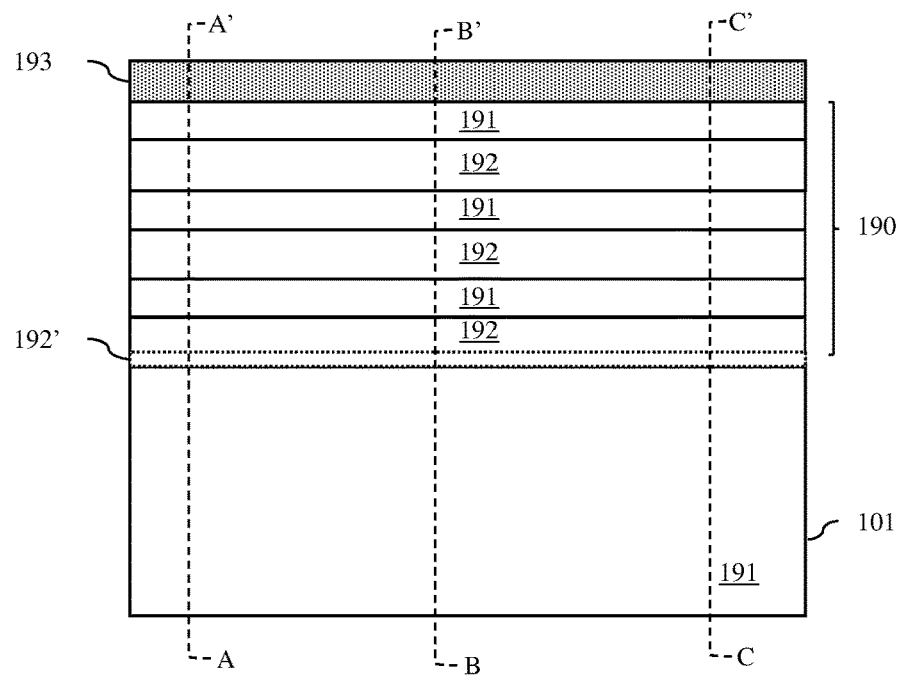
FIGS. 3A-3B are cross-section diagrams of a partially completed IC structure formed according to the flow diagram of FIGS. 2A-2B.

The method can include providing a semiconductor substrate 101 (see process 202 and FIG. 3A). The semiconductor substrate 101 can be made of a first semiconductor material 191. This first semiconductor material 191 can be, for example, monocrystalline silicon. The semiconductor substrate 101 can be a bulk semiconductor structure (as shown). Alternatively, the semiconductor substrate 101 could be the semiconductor layer of a semiconductor-on-insulator (SOI) structure.

The method can further include forming a multi-layer stack on the semiconductor substrate 101 (see process 204, see FIG. 3A). This multi-layer stack can include alternating semiconductors layers of a second semiconductor material 192 and the first semiconductor material 191. That is, an initial layer of the second semiconductor material 192 can be immediately adjacent to the top surface of the semiconductor substrate 101, an initial layer of the first semiconductor material 191 can be on the initial layer of the second semiconductor material, another layer of the second semiconductor material 192 can be on the initial layer of the first semiconductor material 191, and so on. These alternating semiconductor layers can be formed, for example, by epitaxial deposition such that the second semiconductor material 192 and the first semiconductor material 191 are different monocrystalline semiconductor materials. For example, as mentioned above, the first semiconductor material 191 can be monocrystalline silicon. The second semiconductor material 192 can be monocrystalline silicon germanium or any other suitable semiconductor material, which can be used to grow monocrystalline silicon and which can be selectively etched away from monocrystalline silicon during subsequent processing. Optionally, the lowest portion 192' of the lowest layer of the second semiconductor material 192, which is immediately adjacent to the semiconductor substrate 101, can be in situ doped during epitaxial deposition so that this lowest portion 192' can effectively function as an etch stop layer during subsequent processing. For example, if the second semiconductor material 192 is silicon germanium, the lowest portion 192' of the initial layer can be epitaxially deposited so as to have a relatively high germanium concentration compared to that of any subsequently deposited silicon germanium.

For purposes of illustration, the multi-layer stack is shown in FIG. 3A as having six total layers including three layers of the second semiconductor material 192 and three layers of the first semiconductor material 191. However, it should be understood that the figures are not intended to be limiting and that, alternatively, the multi-layer stack could include a total of at least four alternating layers including at least two layers of the first semiconductor material 191 so that, in the resulting stacked pairs of GAAFETs, the first GAAFET will have at least one first channel region and the second GAAFET will have at least one second channel region. Additionally, it should be noted that the thickness of each of the layers of the first semiconductor material 191 in the multi-layer stack should be equal to the desired height of the elongated nanoshapes, which will form the first and second channel regions. Furthermore, the thickness of each of the layers of the second semiconductor material should be equal to the desired spacing between stacked elongated nanoshapes and, particularly, should be great enough to allow for gate material deposition around stacked elongated nanoshapes.

Figure 3B:
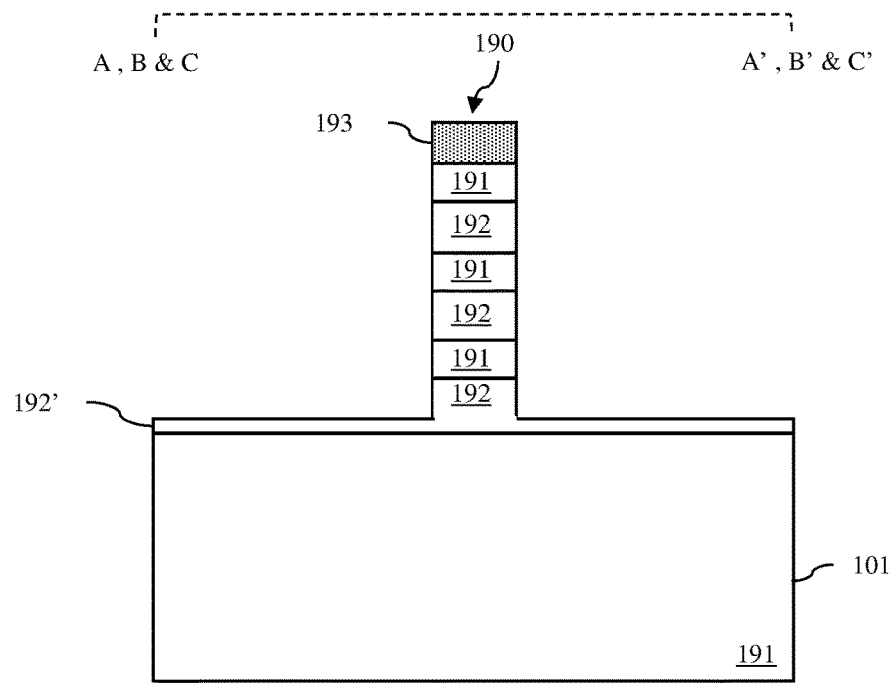

A multi-layer fin 190 with a dielectric fin cap 193 can be formed from the multi-layer stack on the semiconductor substrate 101 (see process 206 and FIGS. 3A-3B). For purposes of this disclosure, a "fin" refers to an elongated, relatively tall, essentially rectangular-shaped body. The multi-layer fin 190 can be formed using conventional processing techniques (e.g., lithographic patterning and etch techniques, sidewall image transfer (SIT) techniques, etc.).

The fin cap 193 can be made of the first dielectric material (e.g., silicon nitride) or some other suitable dielectric material. Etching performed at process 206 can specifically be stopped just above the semiconductor substrate 101 within initial (lowest) layer of the second semiconductor material 192. For example, etching performed at process 206 can be timed so as to avoid exposing the top of the semiconductor substrate. Alternatively, if as mentioned above the lowest portion 192' of the multi-layer stack is doped (e.g., so as to have a relatively high germanium concentration), a selective etch process can be performed with the lowest portion 192' of the multi-layer stack effectively functioning as an etch stop layer.

Figure 4:
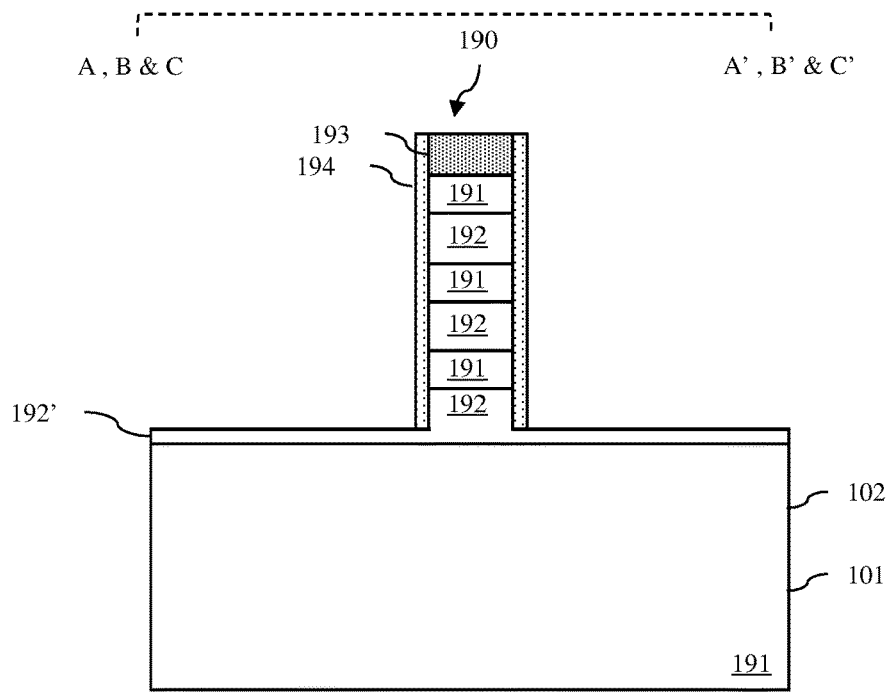
FIG. 4 is a cross-section diagram illustrating a partially completed IC structure formed according to the flow diagram of FIGS. 2A-2B.

Next, dielectric sidewall spacers 194 can be formed on the multi-layer fin 190 above the remaining lowest portion 192' of the lowest layer of the second semiconductor material and positioned laterally adjacent to the sidewalls of the multi-layer fin (see process 208 and FIG. 4). The dielectric sidewall spacers 194 can, for example, be formed using conventional sidewall spacer formation techniques. The dielectric sidewall spacers 194 can be made, for example, of a second dielectric material (e.g., silicon dioxide) or any other suitable dielectric material.

Figure 5:
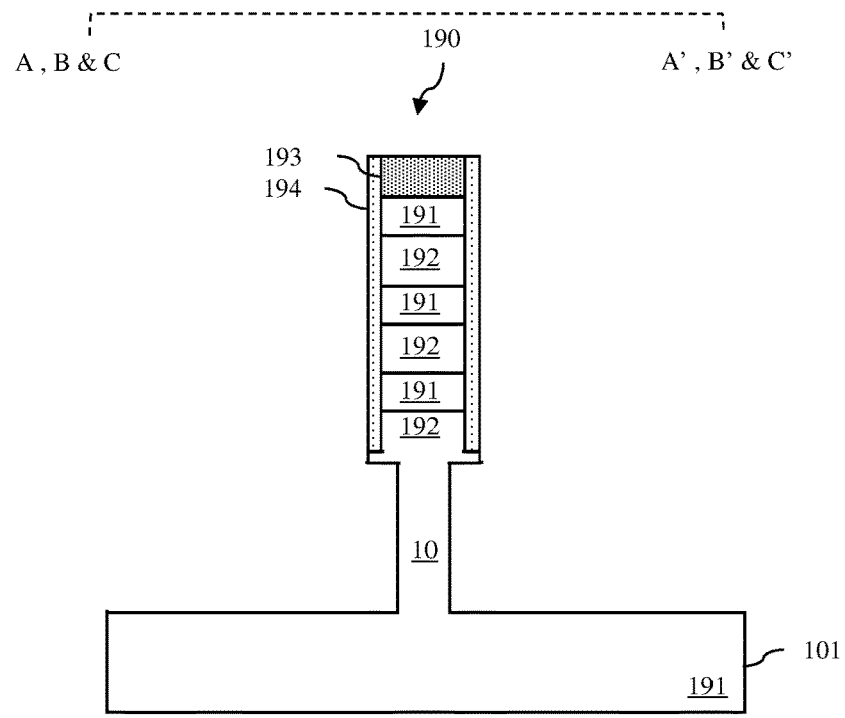
FIG. 5 is a cross-section diagram illustrating a partially completed IC structure formed according to the flow diagram of FIGS. 2A-2B.

Using the multi-layer fin 190 and dielectric sidewall spacers 194 as a mask, at least one additional etch process can be performed in order to etch a semiconductor fin 10 in the upper portion of the semiconductor substrate 101 such that the semiconductor fin 10 is aligned directly below the multi-layer fin 190 (see process 210 and FIG. 5). For example, an anisotropic etch process can be performed so that the width of the semiconductor fin 10 is the same as the combined width of the multi-layer fin 190 with the sidewall spacers 194. Optionally, an additional isotropic etch process can be performed in order to further thin the semiconductor fin 10 such that the width of the semiconductor fin 10 is equal to or less than the width of the multi-layer fin 190.

Figure 6:
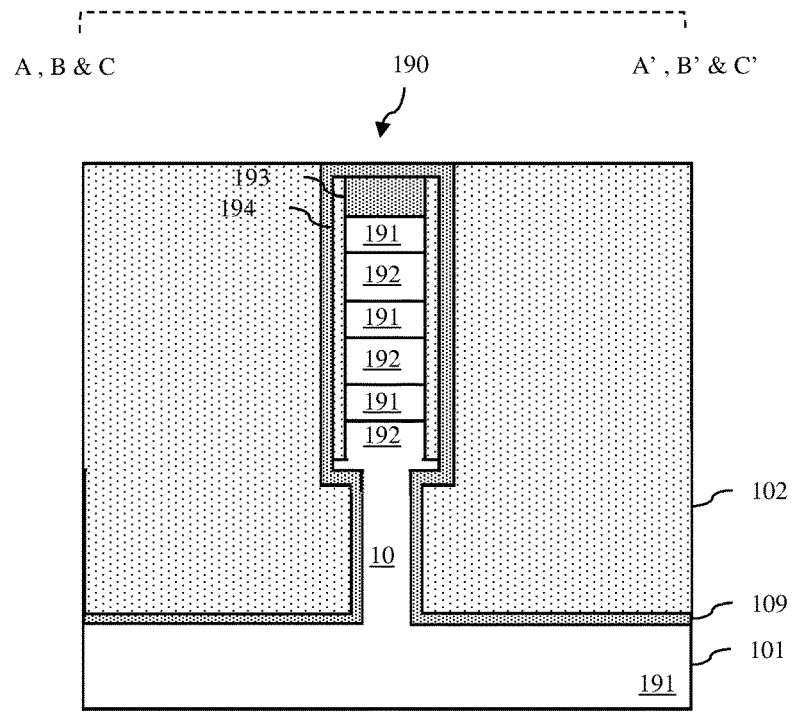
FIG. 6 is a cross-section diagram illustrating a partially completed IC structure formed according to the flow diagram of FIGS. 2A-2B.

An isolation region 102 can then be formed on a lower portion on the semiconductor substrate 101 such that it laterally surrounds the semiconductor fin 10 (see process 212 and FIG. 6). For example, a conformal dielectric layer 109 of the first semiconductor material (e.g., silicon nitride) can be deposited over the partially completed structure. Then, a blanket dielectric layer of the second dielectric material (e.g., silicon dioxide) can be deposited and polished (e.g., using a chemical mechanical polishing (CMP)). At this point in the processing, the height of the isolation region 102 can be at or above the height of the multi-layer fin 190 such that the isolation region 102 also laterally surrounds both the semiconductor fin 10 and the multi-layer fin 190 above.

Figure 7:
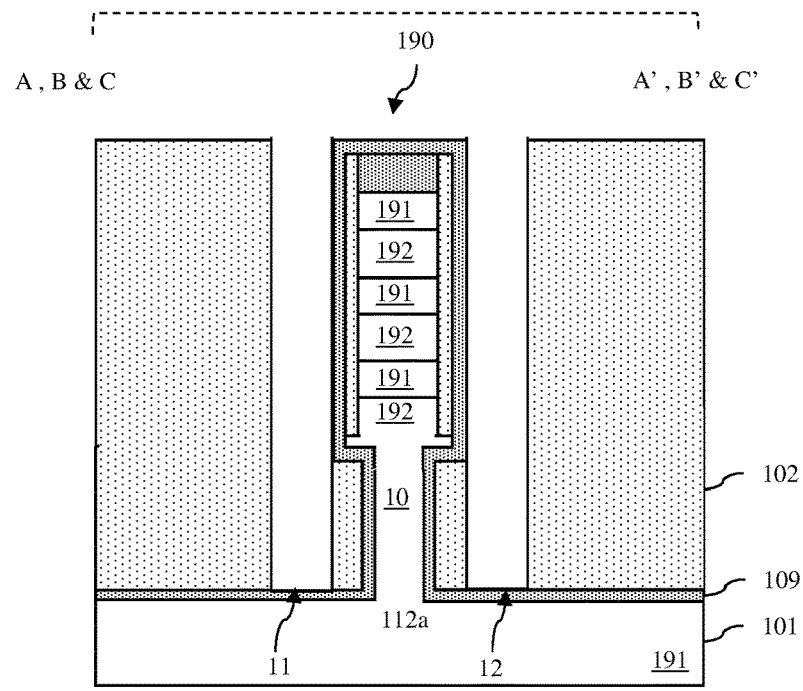
FIG. 7 is a cross-section diagram illustrating a partially completed IC structure formed according to the flow diagram of FIGS. 2A-2B.

Lithographic patterning and etch processes can then be performed in order to form at least one first buried wire trench 11-12 in the isolation region 102 (see process 214 and FIG. 7). Specifically, a first buried wire trench 11 or 12 can be patterned and etched such that it extends vertically through the isolation region 102 (with the conformal dielectric layer 109 functioning as an etch stop layer) and such that it is positioned laterally adjacent to and parallel to the semiconductor fin (and multi-layer fin above). Alternatively, a pair of first buried wire trenches 11 and 12 can be patterned and etched such that they extend vertically through the isolation region 102 (with the conformal dielectric layer 109 functioning as an etch stop layer) and such that the semiconductor fin (and multi-layer fin above) is positioned laterally between the first buried wire trenches 11 and 12 (as shown).

Figure 8:
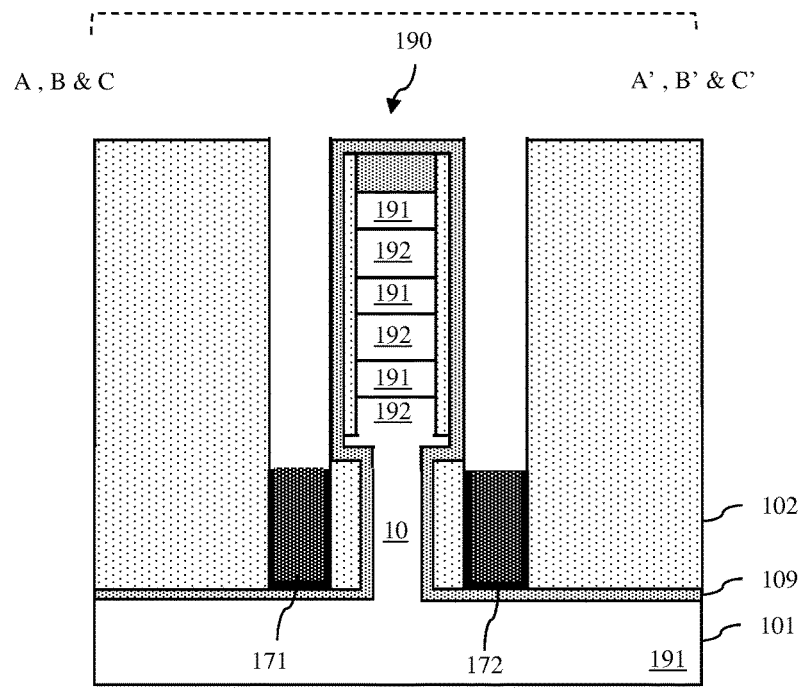
FIG. 8 is a cross-section diagram illustrating a partially completed IC structure formed according to the flow diagram of FIGS. 2A-2B.

Next, first buried wires 171-172 can be formed at the bottom of the first buried wire trenches 11-12 (see process 216 and FIG. 8). For example, at process 216, a metallization process can be performed wherein optional conformal adhesion and/or diffusion barrier layers are deposited so as to line the first buried wire trenches 11-12 and one or more layers of metal and/or metal alloy materials (e.g., tungsten, cobalt, nickel, aluminum, copper, or any other suitable conductor material) can be deposited on the conformal adhesion and/or barrier layers to fill the first buried wire trenches 11-12. Following metallization, the metal materials can be recessed so that the top of the metal within each trench is at or below the level of the top of the semiconductor fin 10. Then another blanket dielectric layer of the second dielectric material 106 (e.g., silicon dioxide) can be deposited to re-fill the first buried wire trenches 11-12, thereby burying the metal and forming the first buried wires 171-172. The first buried wires 171-172 can be, for example, a first buried power wire and/or a first buried signal wire.

Figure 9:
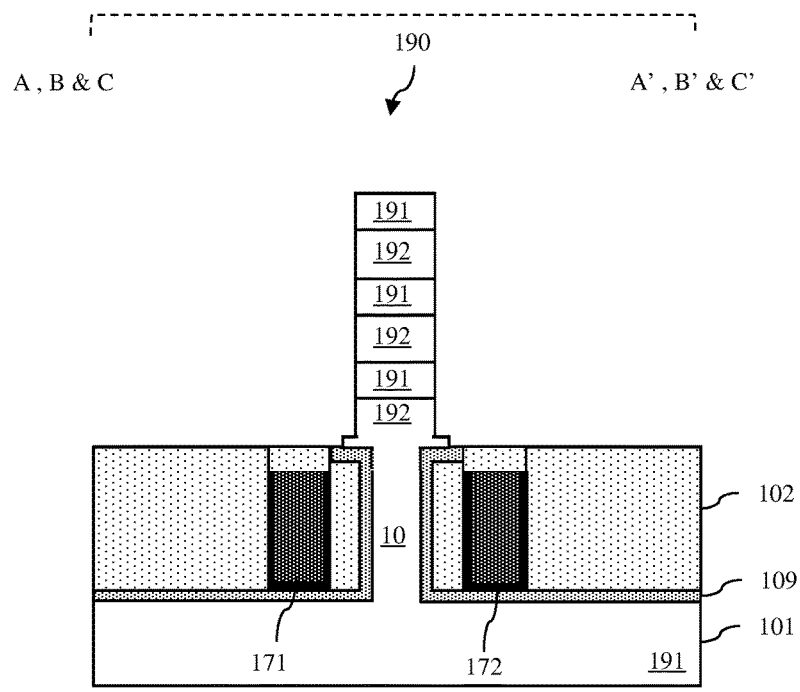
FIG. 9 is a cross-section diagram illustrating a partially completed IC structure formed according to the flow diagram of FIGS. 2A-2B.

After the first buried wires 171-172 is/are formed, one or more etch processes can be performed in order to both etch back (i.e., recess) the isolation region 102 without exposing the first buried wires 171-172 (i.e., stopping above the level of the first buried wires 171-172) and expose the top surface and sidewalls of the multi-layer fin 190 (see process 216 and FIG. 9).

The multi-layer fin 190 can then be used to form at least one stacked pair of transistors and, particularly, a stacked pair of gate-all-around field effect transistors (GAAFETs), wherein each stacked pair of GAAFETs includes a first GAAFET, which has at least one first source/drain region electrically connected to one of the first buried wire(s) 171-172 by a first embedded contact, and a second GAAFET that is above and shares a gate with the first GAAFET. For purposes of illustration, the remaining process steps are described below and illustrated in the drawings with respect to the formation of two adjacent stacked pairs of GAAFETs. However, it should be understood that the description and the drawings are not intended to be limiting and that, alternatively, any number of one or more stacked pairs of GAAFETs could be formed.

Figure 10A:
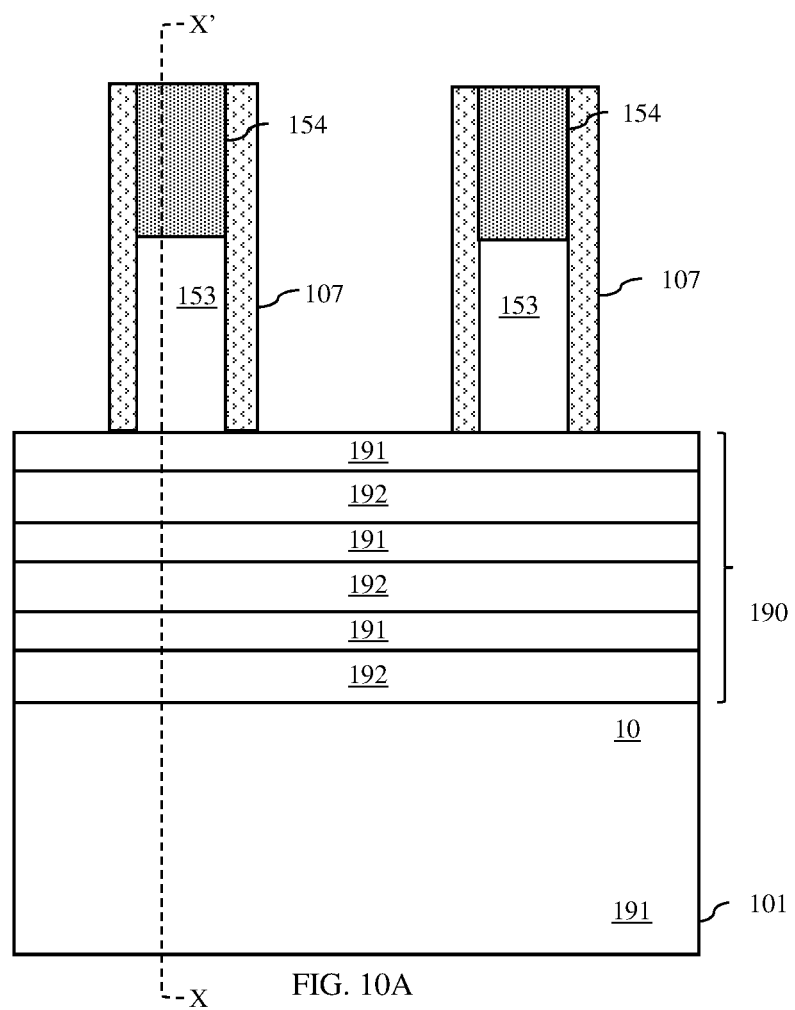
FIGS. 10A-10B are cross-section diagrams of a partially completed IC structure formed according to the flow diagram of FIGS. 2A-2B.
Figure 10B:
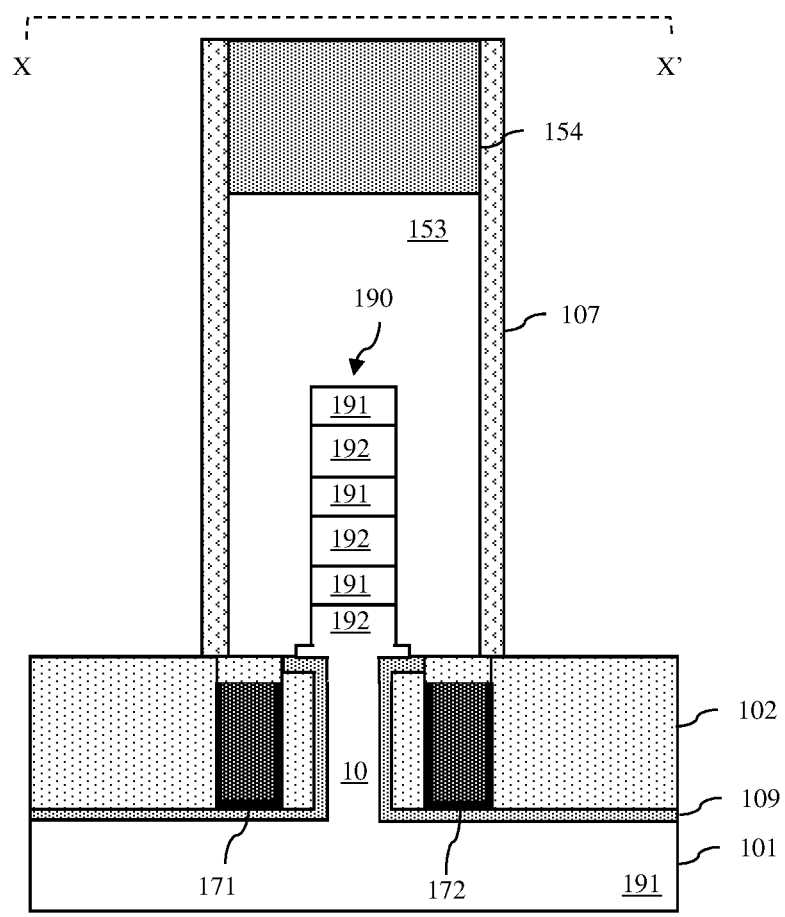

Sacrificial gates 153 with sacrificial gate caps 154 and gate sidewall spacers 107 can be formed on first portions (i.e., designated channel areas) of the multi-layer fin 190 such that second portions (i.e., designated source/drain areas) remain exposed (see process 218 and FIGS. 10A-10B). For example, a thin conformal silicon dioxide layer (not shown) can be deposited over the multi-layer fin 190. A blanket sacrificial gate layer can be deposited onto the conformal silicon dioxide layer. This blanket sacrificial gate layer can be, for example, a polysilicon layer, an amorphous silicon layer or any other suitable sacrificial gate material that is different from the materials of the multi-layer fin (i.e., different from the first semiconductor material 191 and the second semiconductor material 192) and that can be selectively and isotropically etched away from the multi-layer fin during subsequent processing. The sacrificial gate layer can then be polished (e.g., using a chemical mechanical polishing (CMP) process) and a sacrificial cap layer (e.g., a silicon nitride cap layer) can be deposited onto the sacrificial gate layer, thereby forming a sacrificial gate stack. The sacrificial gate stack can then be lithographically patterned and etched to form the sacrificial gates 153 (with sacrificial gate caps 154), wherein the sacrificial gates 153 are positioned adjacent to the top surface and the opposing sides of the first portions of the multi-layer fin 190 and are oriented essentially perpendicular to the fin 190. Gate sidewall spacers 107 can then be formed on the sidewalls of the sacrificial gates 153 using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacers 107 can be made of silicon nitride, silicon carbon nitride, silicon boron carbon nitride or any other suitable sidewall spacer material that is different from the material used for the sacrificial gate 153.

Figure 11A:
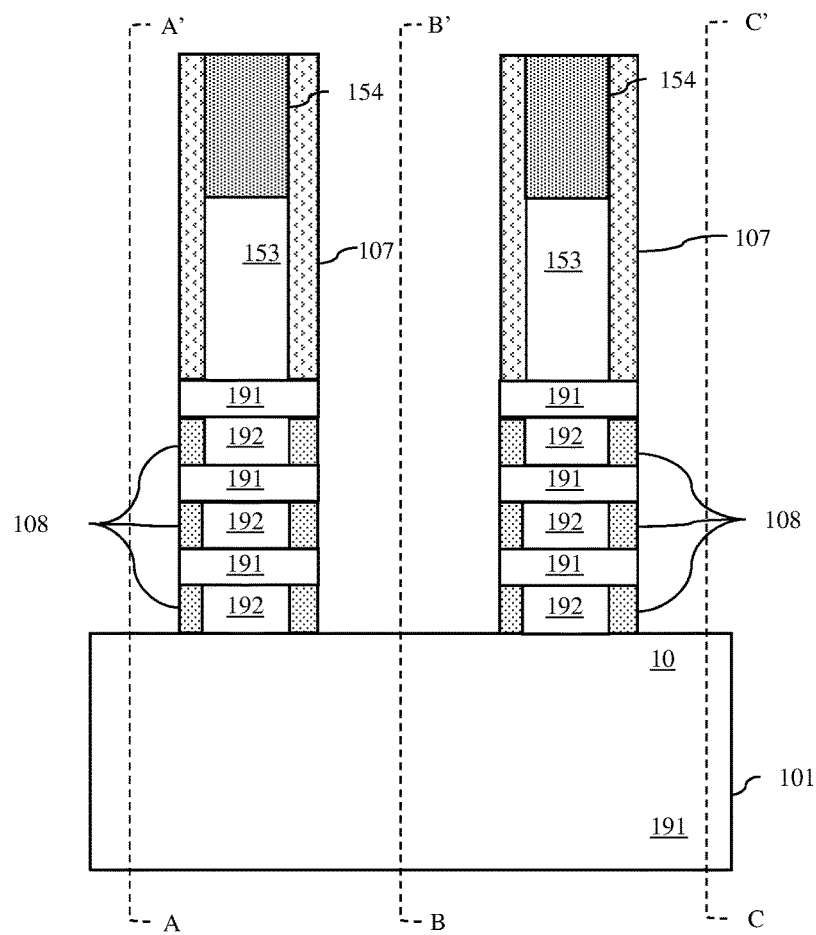
FIGS. 11A-11B are cross-section diagrams of a partially completed IC structure formed according to the flow diagram of FIGS. 2A-2B.
Figure 11B:
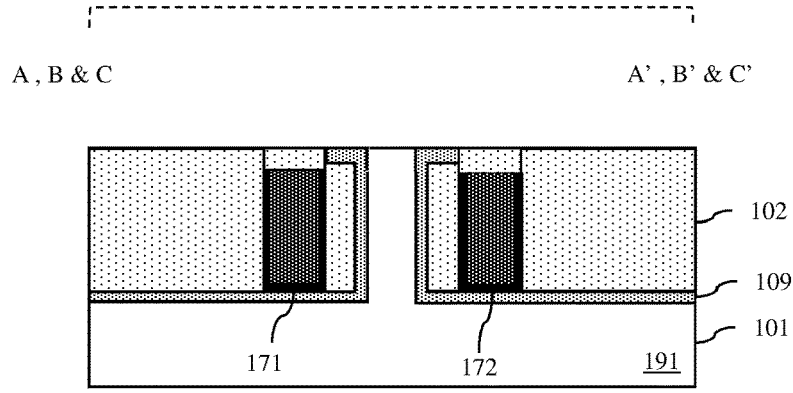

The exposed second portions of the multi-layer fin 190 can be selectively removed (see process 220 and FIGS. 11A-11B). Specifically, an anisotropic etch process can be performed, wherein the etch chemistries used are selective for the materials of the multi-layer fin over the adjacent materials of the isolation region 102, the gate sidewall spacers 107 and the sacrificial gate caps 154. The etch process can be timed so as to stop once the top surface of the isolation region 102 is exposed. Exposed vertical surfaces of the second semiconductor material 192 in the remaining portions of the multi-layer fin 190 can then be laterally etched to form shallow cavities that undercut the first semiconductor material 191 and these shallow cavities can be filled with an isolation material, thereby forming vertically oriented isolation elements 108 (see process 222 and FIGS. 11A-11B). Techniques for etching back the vertical surfaces of the second semiconductor material and for forming the isolation elements 108 are well known in the art. Thus, the details of such techniques have been omitted from the specification in order to allow the reader to focus on the salient aspects of the disclosed method.

Figure 12A:
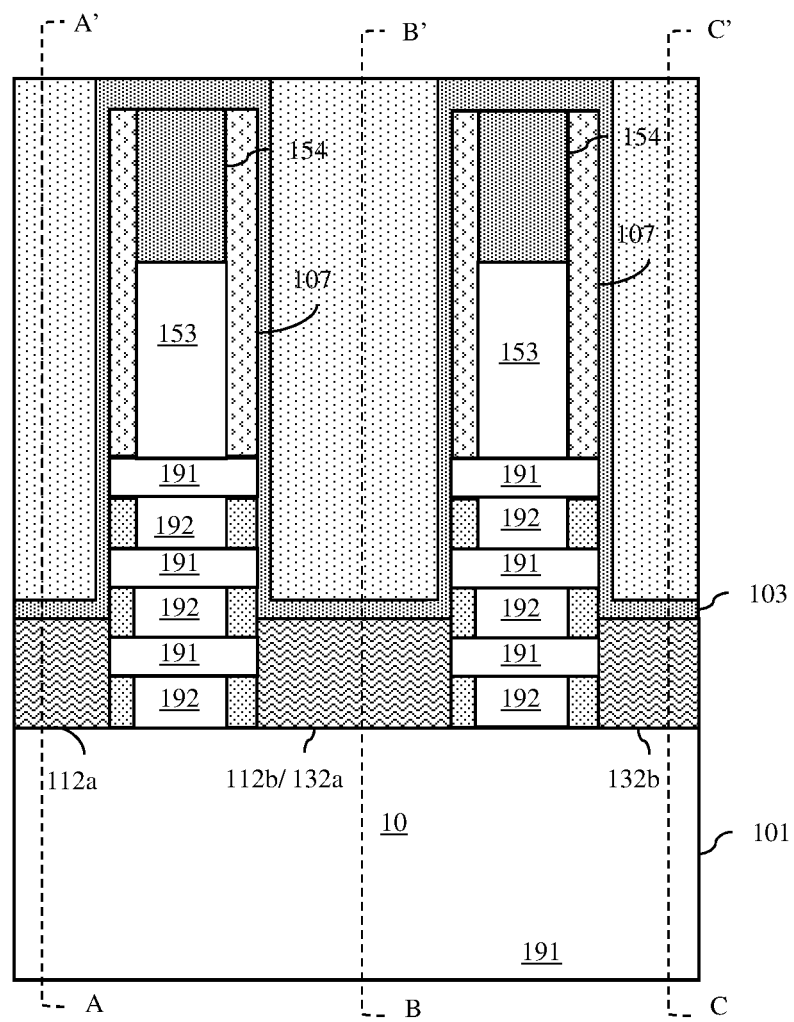
FIGS. 12A-12B are cross-section diagrams of a partially completed IC structure formed according to the flow diagram of FIGS. 2A-2B.
Figure 12B:
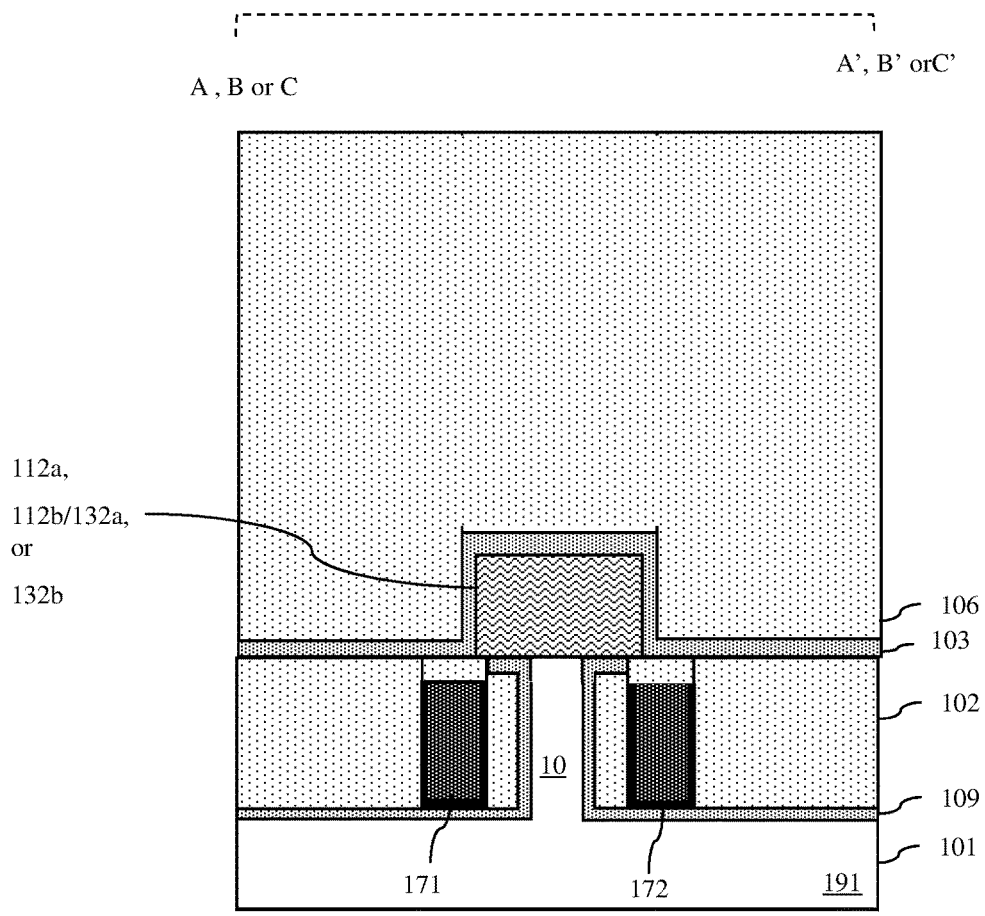

Two first source/drain regions for first GAAFETs (e.g., for P-type GAAFETs) can then be formed on opposing sides of the sacrificial gates 153 such that they are positioned laterally immediately adjacent to the exposed vertical surfaces of at least one layer of the first semiconductor material 191, but not all of the layers of the semiconductor material 191 (see processes 224 and FIGS. 12A-12B). Specifically, an in situ-doped epitaxial semiconductor material can be deposited on the exposed vertical surfaces of the first semiconductor material 191 and then recessed to the desired level for the first source/drain regions 112a-112b, 132a-132b on opposing sides of the sacrificial gates 153. For example, the in-situ doped semiconductor material can be recessed to a level above only one layer of the first semiconductor material so that in the resulting structure the first GAAFETs will have only one first channel region. Alternatively, the in-situ doped semiconductor material can be recessed to a level above two layers of the first semiconductor material so that in the resulting structure the first GAAFETs will have two first channel regions, and so on. In any case, the in-situ doped semiconductor material should be recessed so that it is below the level of at least one layer of the first semiconductor material so the subsequently formed second GAAFETs will have at least one second channel region, as discussed in greater detail below.

After the two first source/drain regions 112a-112b, 132a-132b are formed, a thin conformal dielectric layer 103 of the first dielectric material (e.g., silicon nitride) can be deposited over the partially completed structure (see process 226 and FIGS. 12A-12B). This thin conformal dielectric layer 103 can, for example, be deposited with a horizontal bias (i.e., so that horizontal portions of the layer will be relatively thick as compared to vertical portions). A blanket dielectric layer of the second dielectric material 106 (e.g., an ILD material, such as silicon dioxide) can then be deposited over the partially completed structure and polished (e.g., using a CMP process) to expose the tops of the sacrificial gate caps 154.

Figure 13A:
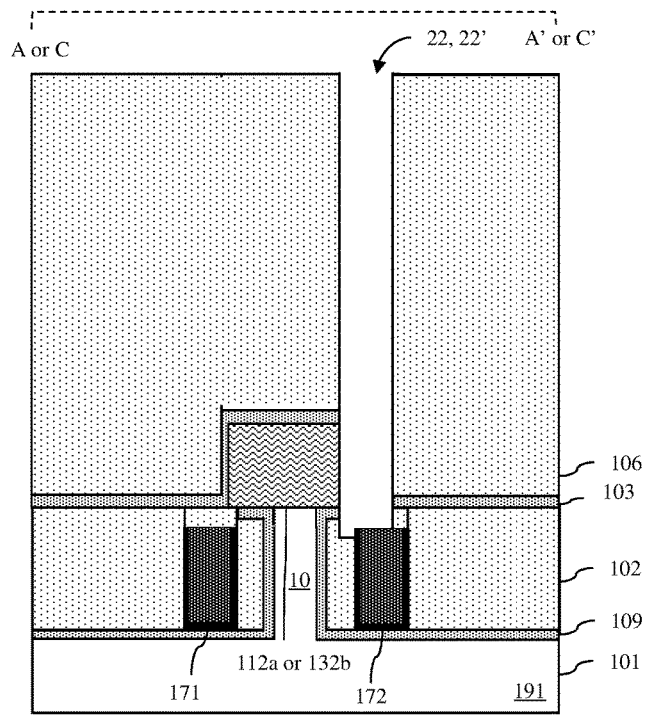
FIGS. 13A-13B are cross-section diagrams of a partially completed IC structure formed according to the flow diagram of FIGS. 2A-2B.
Figure 13B:
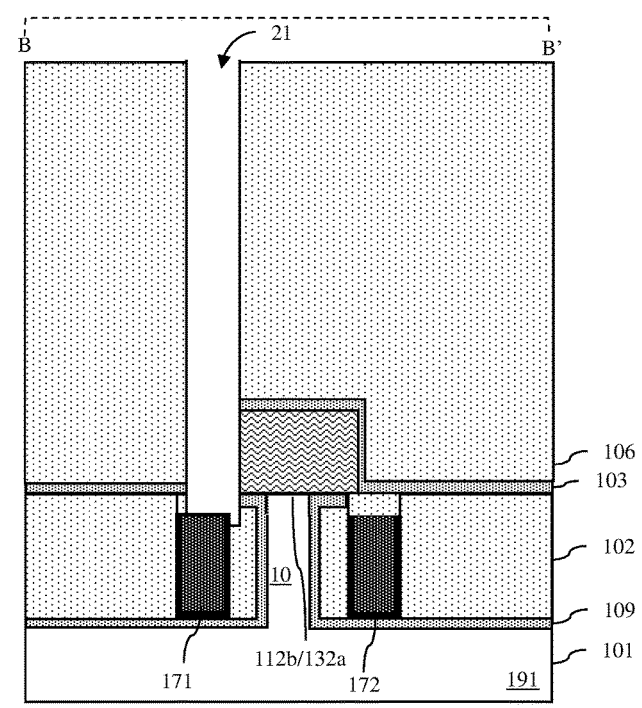

Lithographic patterning and etch processes can be performed in order to form, in the second dielectric material 106, one or more first embedded contact openings, wherein each first embedded contact extends essentially vertically through a corresponding first source/drain region down to a first buried wire (see process 228 and FIGS. 13A-13B). For example, as illustrated in FIG. 13A, a first embedded contact opening 22 can extend vertically through the first source/drain region 112a of the first GAAFET 110 in the pair 150 to the first buried wire 172 on one side of the partially completed structure and another first embedded contact opening 22' can extend vertically through the first source/drain region 132b of the first GAAFET 130 in the pair 155 down to the first buried wire 172 on the same side. Additionally, as illustrated in FIG. 13B, yet another first embedded contact opening 21 can extend vertically through the first source/drain region 112b/132a, which is shared by the first GAAFETs 110, 130, down to a different first buried wire 171, which is on the opposite side of the partially completed structure. As illustrated, each first embedded contact opening 21, 22, 22' can be etched so that at least a side of that first embedded contact opening 21, 22, 22' abuts a corresponding first source/drain region. Each first embedded contact opening 21, 22, 22' can further be etched so that at least the bottom of that first embedded contact opening 21, 22, 22' lands on the top of a first buried wire. Each first embedded contact opening 21, 22, 22' can further be etched so that the first embedded contact opening 21, 22, 22' extends deeper into the isolation region 102 than the top of the first buried wire and, thus, such that a side of the first embedded contact opening 21, 22, 22' abuts a side of the first buried wire.

Figure 14A:
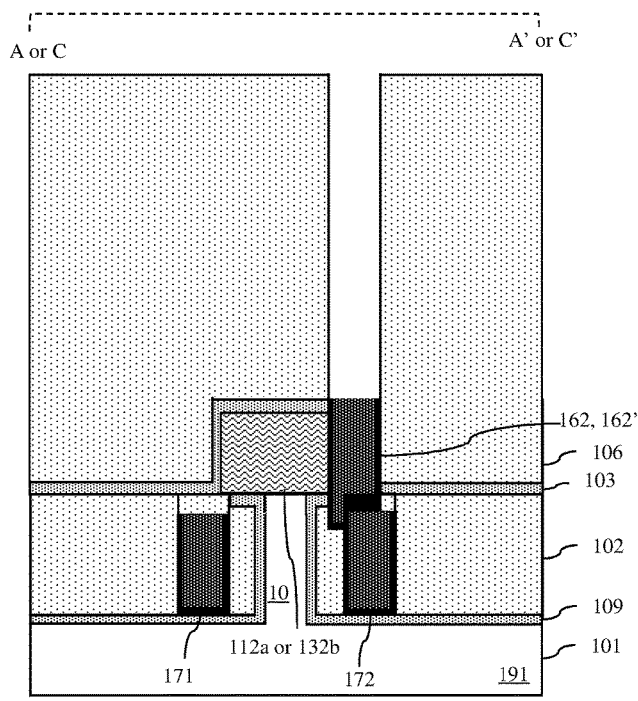
FIGS. 14A-14B are cross-section diagrams of a partially completed IC structure formed according to the flow diagram of FIGS. 2A-2B.
Figure 14B:
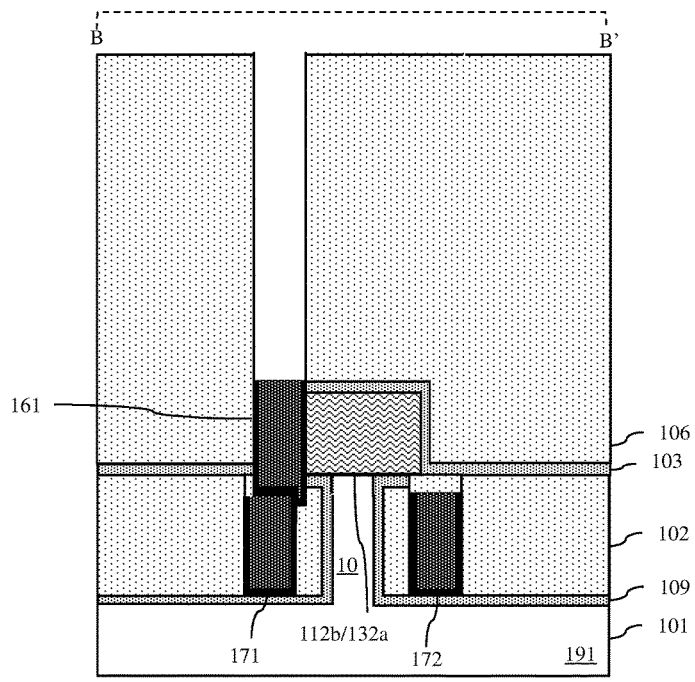

First embedded contacts 161, 162, 162' can be formed in the first embedded contact openings 21, 22, 22', respectively (see process 230 and FIGS. 14A-14B). For example, at process 228, a metallization process can be performed wherein optional conformal adhesion and/or diffusion barrier layers are deposited so as to line the first embedded contact openings 21, 22, 22' and one or more layers of metal and/or metal alloy materials (e.g., tungsten, cobalt, nickel, aluminum, copper, or any other suitable conductor material) can be deposited on the conformal adhesion and/or barrier layers to fill the first embedded contact openings 21, 22, 22'. Following metallization, the metal materials can be recessed so that the top of the metal within each first embedded contact opening is approximately at or below the level of the top of the adjacent first source/drain region. Specifically, the top of the metal within each first embedded contact opening can be recessed so that it is at or lower than the top of the adjacent first source/drain region, but not higher. Recessing should, however, be stopped prior to complete removal of the metal.

Then another blanket dielectric layer of the second dielectric material 106 (e.g., silicon dioxide) can be deposited to re-fill the first embedded contact openings (see process 232). Optionally, a polishing process (e.g., a CMP process) can be performed to again expose the tops of the sacrificial gate caps 154.

Figure 15A:
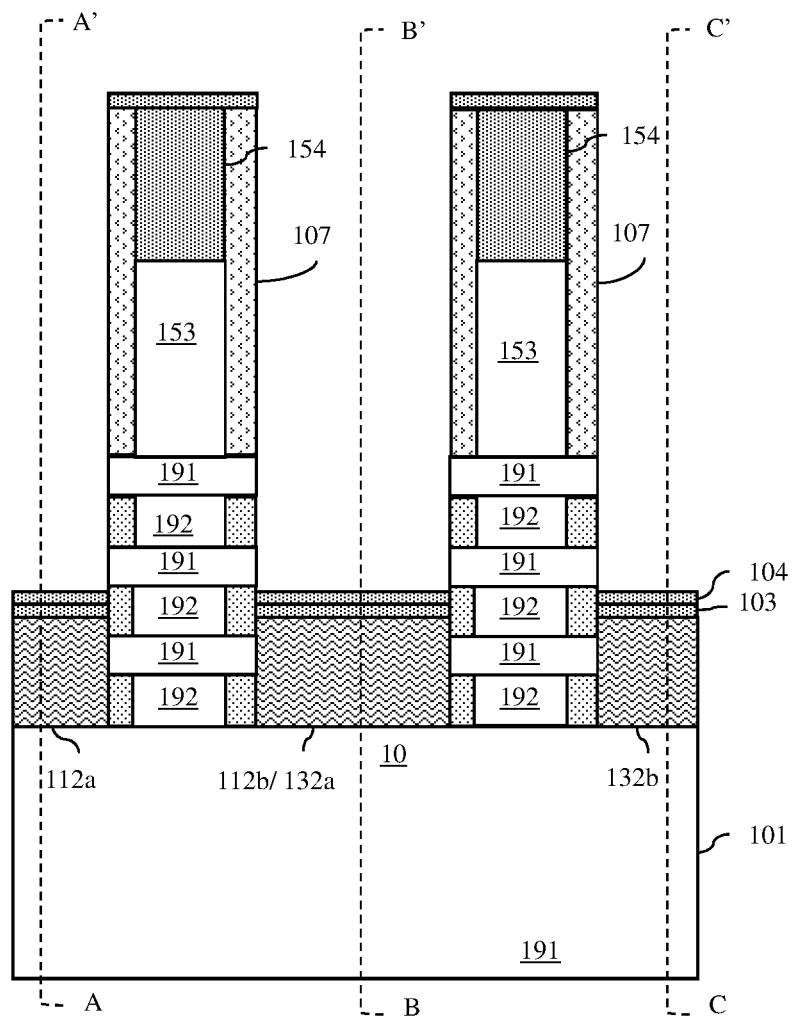
FIGS. 15A-15C are cross-section diagrams of a partially completed IC structure formed according to the flow diagram of FIGS. 2A-2B.
Figure 15B:
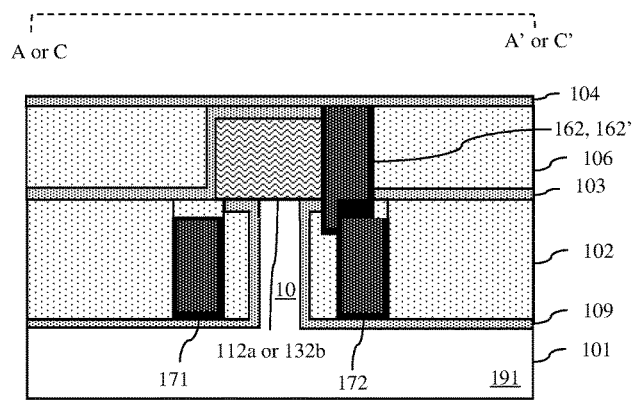
Figure 15C:
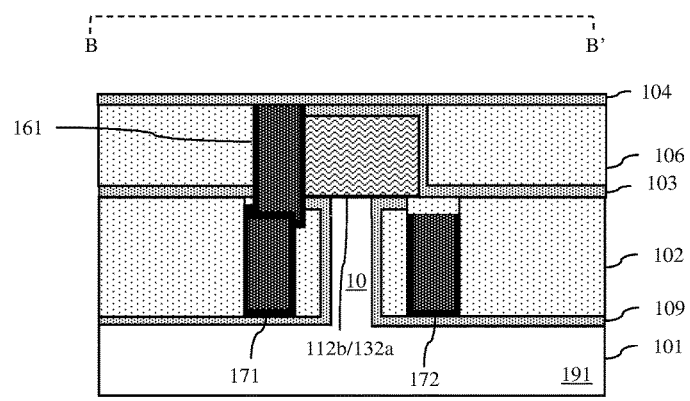
Figure 16A:
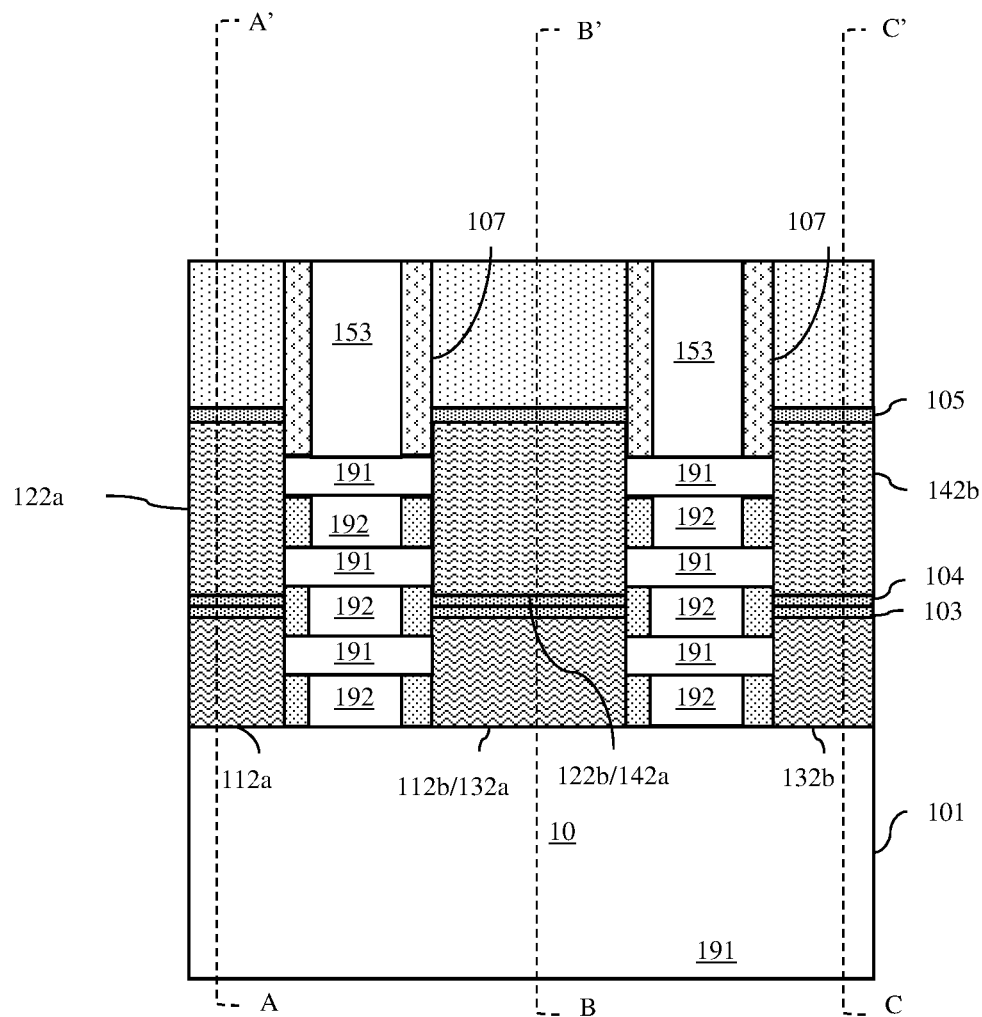
FIGS. 16A-16D are cross-section diagrams of a partially completed IC structure formed according to the flow diagram of FIGS. 2A-2B.
Figure 16B:
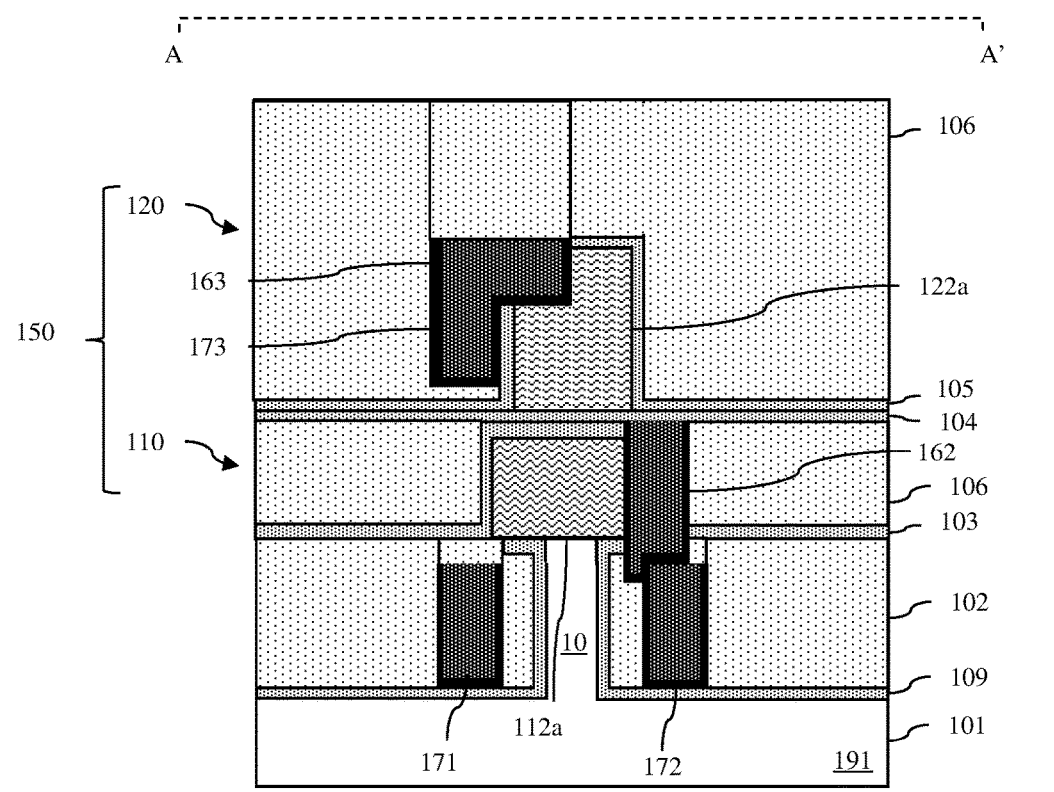
Figure 16C:
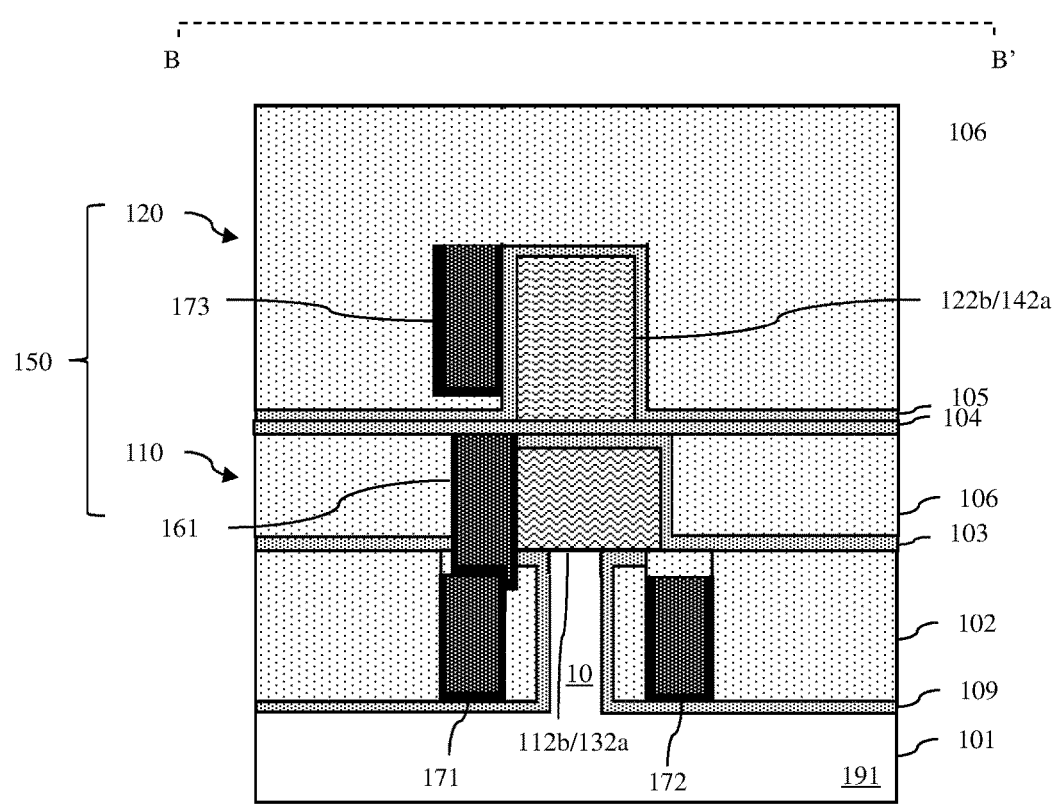
Figure 16D:
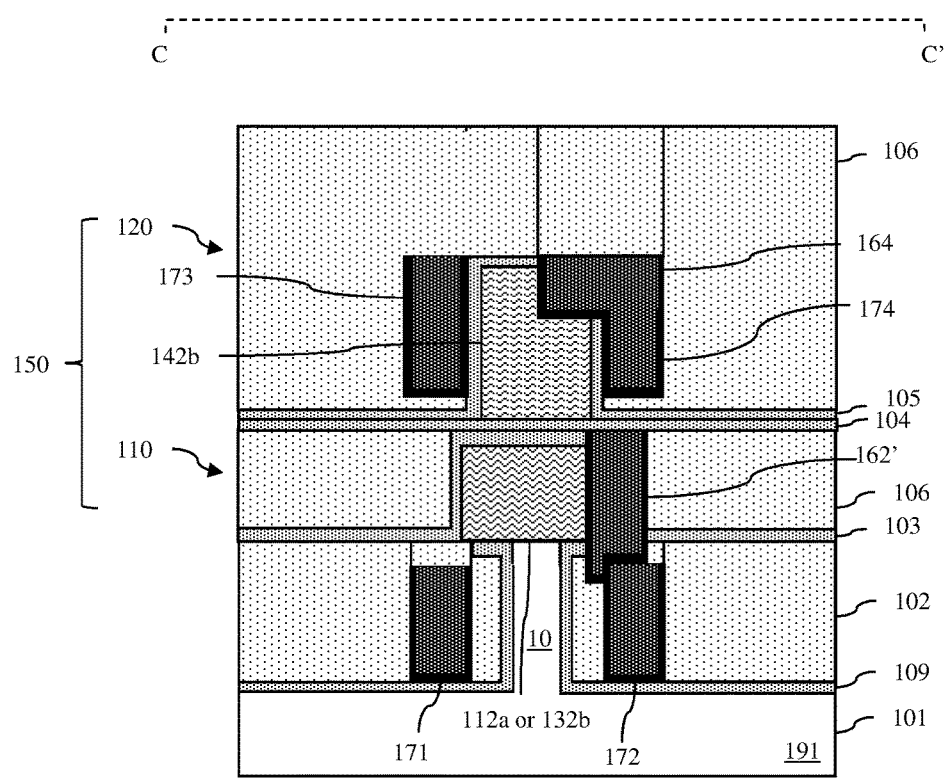

Next, the second dielectric material 106 can be selectively recessed (i.e., etched back) so that the top of the second dielectric material 106 is approximately level with the top of the first source/drain regions 112a-112b, 132a-132b and, particularly, below the level of the bottom surface of any layer of the first semiconductor material 191 that is to be incorporated into the second GAAFETs as a second channel region (see process 234). Then, another thin conformal dielectric layer 104 of the first dielectric material (e.g., silicon nitride) can be deposited over the partially completed structure and, particularly, over the first source/drain regions and the first embedded contacts 161, 162, 162' (see process 236 and FIGS. 15A-15C). This conformal dielectric layer 104 can be deposited with a horizontal bias (i.e., so that horizontal portions of the layer will be relatively thick as compared to vertical portions).

After deposition of the conformal dielectric layer 104, an isotropic etch process can be performed so as to remove relatively thin vertical portions of the conformal dielectric layers 103 and 104 (see process 238 and FIGS. 16A-16D). This isotropic etch process can specifically be used to expose, on opposing sides of the sacrificial gates 153, vertical surfaces of at least one upper layer of the first semiconductor material 191 in the remaining portions of the fin. Since the conformal dielectric layers 103 and 104 were previously deposited with a horizontal bias (i.e., such that the horizontal portions were thicker than the vertical portions), this isotropic etch process can be stopped prior to complete removal of the horizontal portions of the conformal dielectric layers 103 and 104 and, particularly, prior to exposure of the first source/drain regions 112a-b, 132a-b below.

Referring to FIGS. 16A-16D, once vertical surfaces of upper layer(s) of the first semiconductor material 191 are exposed, two second source/drain regions 122a-122b, 142a-142b for second GAAFETs (i.e., for upper GAAFETs) can be formed (see process 240). Specifically, the second GAAFETs can have a second-type conductivity that is different from the first-type conductivity of the first GAAFETs (e.g., the second GAAFETs can be N-type GAAFETs). The second source/drain regions 122a-122b, 142a-142b can be formed by epitaxial deposition of an in situ-doped semiconductor material on the exposed vertical surfaces of the first semiconductor material 191. Thus, the second source/drain regions 122a-122b, 142a-142b will be on opposing sides of the sacrificial gates 153, above and electrically isolated from the first source/drain regions 112a-b, 132a-b by the dielectric layers 103 and 104.

Another thin dielectric layer 105 of the first dielectric material (e.g., silicon nitride) can be deposited so as to cover the second source/drain regions, another blanket dielectric layer of the second dielectric material 106 (e.g., an interlayer dielectric (ILD) material, such as silicon dioxide) can be deposited on the conformal dielectric layer 105 and the second dielectric material 106 can be polished (e.g., using a CMP process) to expose the tops of the sacrificial gate caps 154 (see process 242).

Next, one or more second buried wires 173-174 can be formed adjacent to one or more second source/drains and one or more second embedded contacts 163-164 can be formed to electrically connect the second source/drain region(s) to the second buried wire(s), respectively (see process 244 and FIGS. 16A-16D). Specifically, multiple lithographic patterning and etch processes can then performed in order to form, in the second dielectric material 106 at the same level as the second source/drain regions, at least one second buried wire trench and at least one second embedded contact opening that extends laterally between a second source/drain region and a second buried wire trench. Then, one or more metallization processes can be performed in order to form a second buried wire 173-174 in each second buried wire trench and a second embedded contact 163-164 in each second embedded contact opening in order to electrically connect a second source/drain region to a second buried wire 173-174. For example, discrete metallization processes can be performed after formation of second buried wire trenches to form second buried wires 173-174 and also after formation of second embedded contact openings to form second embedded contacts 163-164 the (or vice versa). Alternatively, back-to-back patterning and etch processes can be performed and followed by a single metallization process wherein second buried wires 173-174 and second embedded contacts 163-164 are simultaneously formed in second buried wire trenches and second embedded contact openings, respectively. In any case, each metallization process can include, for example, optional conformal deposition of adhesion and/or diffusion barrier layers and also deposition one or more layers of metal and/or metal alloy materials (e.g., tungsten, cobalt, nickel, aluminum, copper, or any other suitable conductor material) on the optional adhesion and/or diffusion barrier layers). Following the metallization process(es), the metal material can be recessed so that the tops of the second buried wires 173-174 and the second embedded contacts 163-164 are essentially level and below the level of the top of the second dielectric material 106.

Then, yet another blanket dielectric layer of the second dielectric material 106 can be deposited to re-fill the second buried wire trenches and the second embedded contact openings and a polishing process (e.g., a CMP process) can be performed to remove the sacrificial gate caps 154 and expose the tops of the sacrificial gates 153 (see process 246 and FIGS. 16A-16D). It should be understood that if a single metallization process is performed, the second buried wires 173-174 and second embedded contacts 163-164 that abut the second buried wires 173-174 will be different portions of a single, contiguous metal conductor and, thus, will exhibit reduced resistance.

Figure 17A:
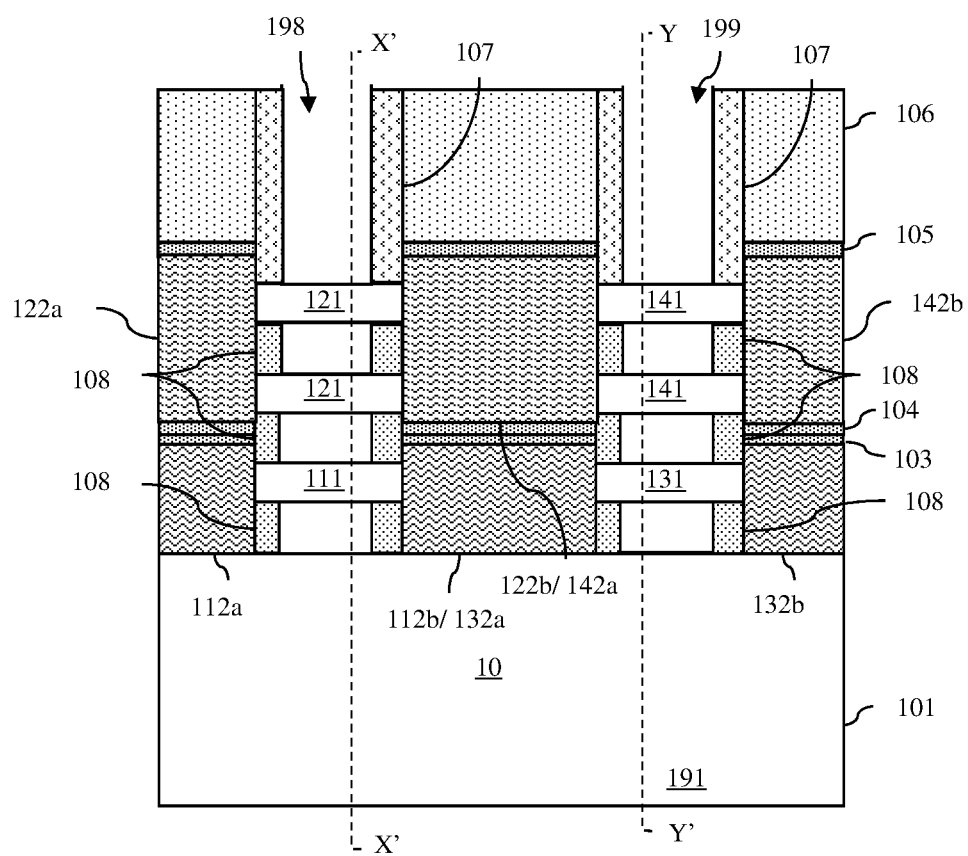
FIGS. 17A-17C are cross-section diagrams of a partially completed IC structure formed according to the flow diagram of FIGS. 2A-2B.
Figure 17B:
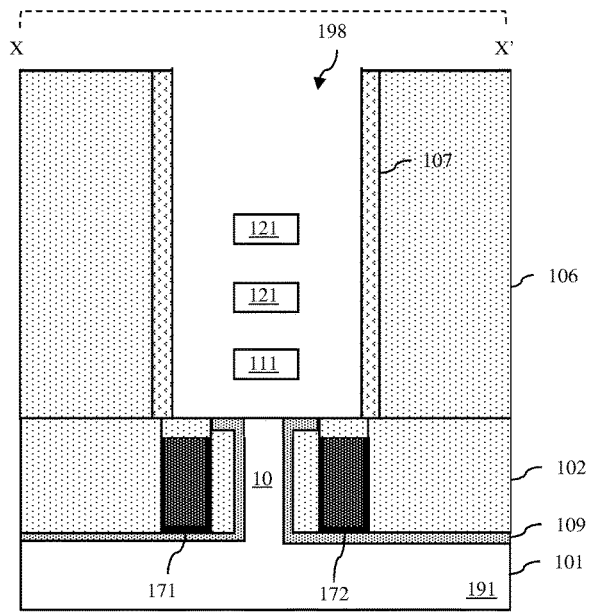
Figure 17C:
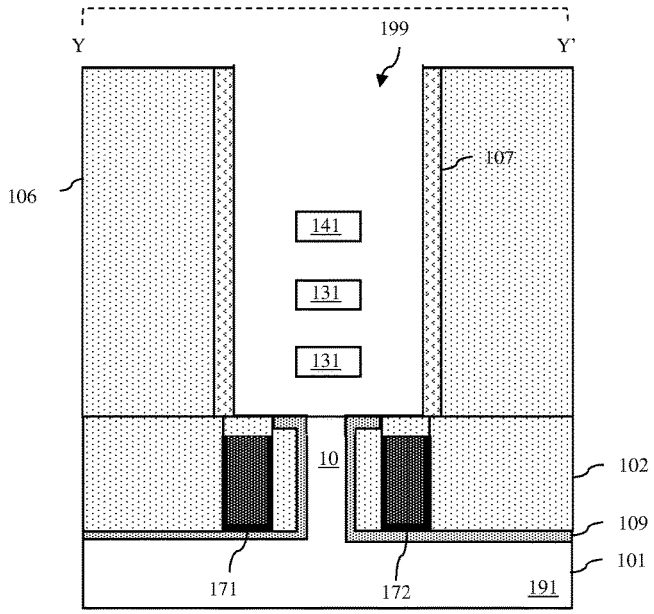

Referring to FIGS. 17A-17C, the sacrificial gates 153 can then be selectively removed, thereby creating first portions of gate openings 198-199, respectively (see process 248). That is, a selective etch process can be performed to selectively etch away the material of the sacrificial gate layer over the materials of the multi-layer fin (i.e., over the first semiconductor material 191 and the second semiconductor material 192) and also over the adjacent dielectric materials, thereby creating first portions of gate openings 198-199 that expose the remaining portions of the multi-layer fin. Techniques for selectively removing sacrificial gates are well known in the art. Thus, these techniques are omitted from the specification in order to allow the reader to focus on the salient aspects of the disclosed methods.

Once the first portions of the gate openings 198-199 are formed, the second semiconductor material 192 exposed within the first portions of the gate openings 198-199 can be selectively etched away to form second portions of the gate openings 198-199, respectively (see process 250). Specifically, a selective isotropic etch process can be used to selectively and isotropically etch exposed second semiconductor material without etching the first semiconductor material or the various dielectric materials. Techniques for selectively and isotropically etching one material over others depend upon the different materials, are well known in the art and are omitted from the specification in order to allow the reader to focus on the salient aspects of the disclosed methods.

As a result of process 250 (i.e., as a result of forming the second portions of the gate openings), at least one discrete elongated nanoshape of the first semiconductor material 191 will extend laterally between the first sources/drain regions 112a-112b, 132a-132b in the gate openings 198, 199, thereby forming first channel region(s) 111, 131, respectively. Furthermore, at least one discrete elongated nanoshape of the first semiconductor material 191 will extend laterally between the second source/drain regions 122a-122b, 142a-142b in the gate openings 198, 199, thereby forming second channel region(s) 121, 141, respectively.

Referring to FIGS. 1A-1D, shared gates 151, 156 can then be formed in the gate openings 198, 199 (see process 252). Specifically, the shared gate 151 can be formed in the gate opening 198 adjacent to the first channel region(s) 111 and the second channel region(s) 121. Furthermore, the shared gate 156 can be formed in the gate opening 199 adjacent to the first channel region(s) 131 and the second channel region(s) 141. The shared gates can be formed using replacement metal gate (RMG) formation techniques. In one exemplary embodiment, the shared gates 151, 152 can be formed as single work function RMGs. In another exemplary embodiment, as described below, the shared gates 151, 156 can be formed so as dual work function RMGs.

For example, the shared dual work function RMGs can each have a lower section (1) and an upper section (u) above the lower section. The lower section (1) can be on the semiconductor substrate and can be adjacent to the first channel region(s) and the upper section (u) can be above the lower section (1) and can be adjacent to the second source/drain region(s). For example, in the case of a stacked pair of GAAFETs, the lower section (1) can wrap around the first channel region(s) (i.e. can be above, below and on the opposing sides of the first channel region(s)) and the upper section (u) can wrap around the second channel region(s) (i.e. can be above, below and on the opposing sides of the second channel region(s)). Furthermore, the lower section (1) can have a first work function optimal for performance of a FET with a first-type conductivity (e.g., for a P-type FET) and the upper section (u) can have a second work function optimal for performance of a FET with a second-type conductivity (e.g., for an N-type FET).

To form such shared dual work function RMGs 151, 156, a conformal gate dielectric layer (e.g., a conformal high-K gate dielectric layer) can be deposited so that it is immediately adjacent to the first channel region(s) and the second channel region(s). A conformal first work function metal layer can then be deposited, followed by deposition of a conductive fill material. These metals can be recessed to expose the second channel region(s) in each gate opening. Then, a conformal second work function metal layer, which is different from the first work function metal layer, can be deposited, followed again by deposition of the conductive fill material. These metals can then be recessed without exposing the second channel region(s) in each opening, thereby forming the shared RMGs 151, 156. Next, a dielectric gate cap material (e.g., silicon nitride) can be deposited and a polishing process (e.g., a CMP process) can be performed in order to remove any of the dielectric gate cap material from above the second dielectric material 106, thereby forming the dielectric gate caps 157 on the shared RMGs 151, 156 (see process 256).

Conventional middle of the line (MOL) and back end of the line (BEOL) processing can then be performed in order to compete the IC structure (see process 258). MOL processing can include, but is not limited to, the formation of MOL contacts 181, 182 to the shared RMGs 151, 156 and the formation of MOL contacts to any second source/drain regions (not shown), as necessary. BEOL processing can include, but is not limited to, the formation of the various metal level wires, such as BEOL wires 183 and 184 connected to the gate contacts 181 and 182, respectively, and any other BEOL wires required.

It should be understood the method described above and illustrated in the figures is not intended to be limiting. Different techniques could alternatively be used to form the IC structure shown in FIGS. 1A-1E. Furthermore, different embodiments of the disclosed method could include the formation of one or more stacked pairs of GAAFETs and could further include the formation of different combinations of the above-mentioned metal components. For example, different embodiments of the method could include the formation of embedded contacts in first source/drain regions connected to metal level wires through insulated contacts, but not the formation of a first buried wire and embedded contacts connected thereto, or vice versa.

In the above-described structure and method embodiments the first FETs 110, 130 are described as having the first-type conductivity (e.g., as being P-type) and the second FETs 120, 140 are described as having the second-type conductivity (e.g., as being N-type FET). For a P-type FET, the channel region(s) can have N-type conductivity at a relatively low conductivity level (or can be undoped) and the source/drain regions can have P-type conductivity at a relatively high conductivity level; whereas, for an N-type FET, the channel region(s) can have P-type conductivity at a relatively low conductivity level (or can be undoped) and the source/drain regions can have N-type conductivity and a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the above-described structure and method embodiments the shared gates 151, 156 are described as, optionally, being shared dual work function RMGs with a lower section (1) having a first work function and an upper section (u) having a second work function. In these dual work function RMGs, the gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The different work function metals of the lower and upper section can be preselected in order to achieve the optimal gate conductor work function given the conductivity type of the FET. For example, the optimal gate conductor work function for the P-type FETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for N-type FETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
    an isolation region on a semiconductor substrate laterally surrounding a semiconductor fin;
    a first buried wire within the isolation region parallel to the semiconductor fin;
    a first transistor comprising two first source/drain regions on the semiconductor fin, wherein side portions of the two first source/drain regions extend over the isolation region and wherein at least one first channel region is positioned laterally between the two first source/drain regions;
    a first embedded contact electrically connecting a first source/drain region of the two first source/drain regions to the first buried wire;
    a dielectric layer above the first source/drain regions and extending laterally over the first embedded contact; and
    a second transistor comprising: two second source/drain regions on the dielectric layer above the two first source/drain regions, respectively; and at least one second channel region positioned laterally between the two second source/drain regions.

2. The integrated circuit structure of claim 1, the two second source/drain regions and the at least one second channel region being aligned above the two first source/drain regions and the at least one first channel region, respectively, and the two second source/drain regions being electrically isolated from the two first source/drain regions and the first embedded contact by the dielectric layer.

3. The integrated circuit structure of claim 1, the first transistor and the second transistor having a shared gate adjacent to the at least one first channel region and the at least one second channel region.

4. The integrated circuit structure of claim 1, the first buried wire being one of a first buried power wire and a first buried signal wire.

5. The integrated circuit structure of claim 1, the first embedded contact contacting a side surface of the first source/drain region and at least a top surface of the first buried wire.

6. The integrated circuit structure of claim 1, further comprising:
    an additional first buried wire in the isolation region parallel to the semiconductor fin such that the semiconductor fin is positioned laterally between two first buried wires; and
    an additional first embedded contact in a different first source/drain region of the two first source/drain regions and electrically connecting the different first source/drain region to the additional first buried wire.

7. The integrated circuit structure of claim 6, the two first buried wires comprising a first buried signal wire and a first buried power wire.

8. The integrated circuit structure of claim 1, further comprising:
    a second buried wire in dielectric material positioned laterally adjacent to a second source/drain region of the two second source/drain regions of the second transistor, wherein the second buried wire is aligned above the first buried wire; and
    a second embedded contact in the second source/drain region and extending laterally to the second buried wire.

9. The integrated circuit structure of claim 8, the second buried wire comprising one of a second buried signal wire and a second buried power wire.

10. An integrated circuit structure comprising:
an isolation region on the semiconductor substrate laterally surrounding a semiconductor fin;
two first buried wires within the isolation region, the semiconductor fin being between and parallel to the two first buried wires;
a first transistor comprising two first source/drain regions on the semiconductor fin, wherein side portions of the two first source/drain regions extend over the isolation region and wherein at least one first channel region is positioned laterally between the first source/drain regions;
two first embedded contacts in the two first source/drain regions, respectively,
  wherein one of the two first embedded contacts extends vertically from one of the two first source/drain regions to one of the two first buried wires and a different one of the two first embedded contacts extends vertically from a different one of the two first source/drain regions to a different one of the two first buried wires;
a dielectric layer above the two first source/drain regions and extending laterally over the two first embedded contacts; and
a second transistor comprising: two second source/drain regions on the dielectric layer above the two first source/drain regions; and at least one second channel region positioned laterally between the second source/drain regions,
  wherein the two second source/drain regions and the at least one second channel region are aligned above the first source/drain regions and the at least one first channel region, respectively, and
  wherein the two second source/drain regions are electrically isolated from the two first source/drain regions and the two first embedded contacts by the dielectric layer.

11. The integrated circuit structure of claim 10, the first transistor and the second transistor having a shared gate adjacent to the at least one first channel region and the at least one second channel region.

12. The integrated circuit structure of claim 10, the two first buried wires comprising a first buried power wire and a first buried signal wire.

13. The integrated circuit structure of claim 10, each first embedded contact contacting a side surface of a first source/drain region and at least a top surface and sidewall of a first buried wire.

14. The integrated circuit structure of claim 10, further comprising:
a second buried wire within dielectric material adjacent to a second source/drain region of the two second source/drain regions, wherein the second buried is aligned above one of the two first buried wires; and
a second embedded contact in the second source/drain region and extending laterally to the second buried wire.

15. The integrated circuit structure of claim 14, the second buried wire comprising one of a second buried signal wire and a second buried power wire.

* * * * *